(12) United States Patent
Kajihara et al.

(10) Patent No.: US 10,398,038 B2
(45) Date of Patent: *Aug. 27, 2019

(54) PRINTED WIRING BOARD AND METHOD FOR MANUFACTURING PRINTED WIRING BOARD

(71) Applicant: IBIDEN CO., LTD., Ogaki (JP)

(72) Inventors: Kazuki Kajihara, Ogaki (JP); Naoki Kurahashi, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/793,084

(22) Filed: Oct. 25, 2017

(65) Prior Publication Data

US 2018/0116057 A1    Apr. 26, 2018

(30) Foreign Application Priority Data

Oct. 25, 2016 (JP) ................. 2016-208878

(51) Int. Cl.
*H05K 1/18* (2006.01)
*H05K 3/46* (2006.01)
(Continued)

(52) U.S. Cl.
CPC ....... *H05K 3/4697* (2013.01); *H01L 21/4857* (2013.01); *H05K 1/036* (2013.01); *H05K 1/09* (2013.01); *H05K 1/186* (2013.01); *H05K 3/0032* (2013.01); *H05K 3/4655* (2013.01); *H05K 3/4682* (2013.01); *H05K 1/0298* (2013.01);
(Continued)

(58) Field of Classification Search
CPC ...... H05K 3/4697; H05K 1/036; H05K 1/186; H05K 3/0032; H05K 3/4655; H05K 3/4682; H05K 1/0298; H05K 1/0306; H05K 1/183; H05K 2201/0209; H05K 2203/308
See application file for complete search history.

(56) References Cited

U.S. PATENT DOCUMENTS

2007/0096292 A1* 5/2007 Machida ............. H01L 21/4857
257/700
2008/0079163 A1* 4/2008 Kurita ................. H01L 21/6835
257/759

(Continued)

FOREIGN PATENT DOCUMENTS

WO   WO 2011/099820 A2   8/2011

*Primary Examiner* — Steven T Sawyer
(74) *Attorney, Agent, or Firm* — Oblon, McClelland, Maier & Neustadt, L.L.P.

(57) ABSTRACT

A printed wiring board includes a laminate, conductor posts formed on a surface of the laminate, and a mold resin layer formed on the surface of the laminate such that the posts are in the mold layer covering side surfaces of the posts. The laminate includes conductor layers and one or more resin insulating layers, the conductor layers includes a first conductor layer embedded in a resin insulating layer forming the surface of the laminate and has one surface exposed on the surface of the laminate, the first conductor layer includes first and second conductor pads such that the second pads are formed on outer peripheral side of the first pads, the mold layer has a cavity exposing the first pads, the posts are formed on the second pads on the surface of the laminate, and the first conductor layer includes fan-out wirings extending from inside to outside the cavity.

20 Claims, 17 Drawing Sheets

(51) Int. Cl.
   *H01L 21/48* (2006.01)
   *H05K 1/03* (2006.01)
   *H05K 1/09* (2006.01)
   *H05K 3/00* (2006.01)
   *H05K 1/02* (2006.01)
   *H05K 3/40* (2006.01)
(52) U.S. Cl.
   CPC ........... *H05K 1/0306* (2013.01); *H05K 1/183* (2013.01); *H05K 3/0097* (2013.01); *H05K 3/4007* (2013.01); *H05K 2201/0209* (2013.01); *H05K 2203/308* (2013.01)

(56) References Cited

U.S. PATENT DOCUMENTS

| | | | | |
|---|---|---|---|---|
| 2010/0213616 | A1* | 8/2010 | Uchiyama | H01L 21/563 257/773 |
| 2010/0289134 | A1* | 11/2010 | Chow | H01L 21/563 257/692 |
| 2011/0291249 | A1* | 12/2011 | Chi | H01L 21/4832 257/675 |
| 2015/0092357 | A1* | 4/2015 | Yoshikawa | H01L 25/00 361/746 |
| 2015/0156880 | A1* | 6/2015 | Daizo | H05K 1/183 174/251 |

* cited by examiner

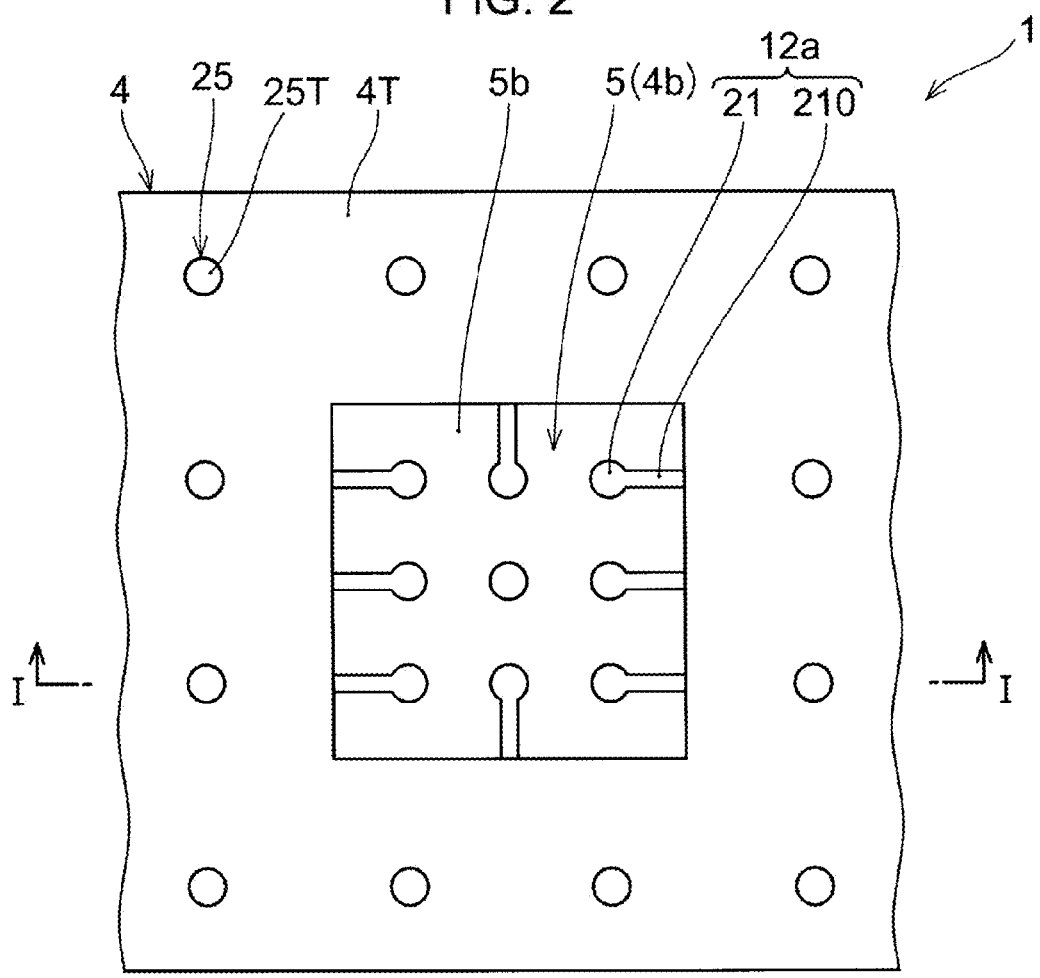
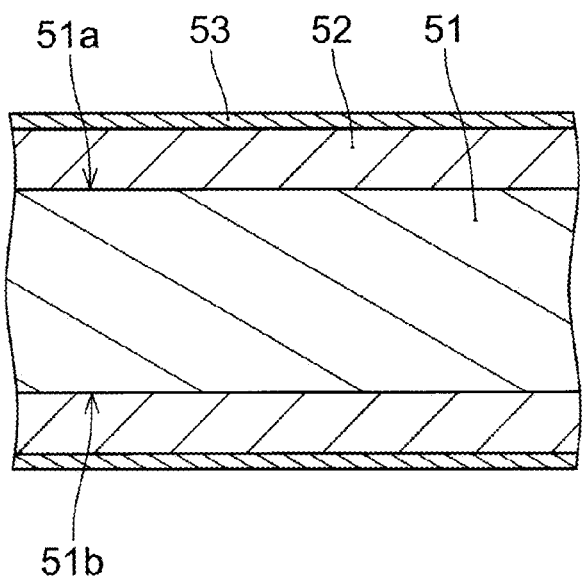

PRINTED WIRING BOARD AND METHOD FOR MANUFACTURING PRINTED WIRING BOARD

CROSS-REFERENCE TO RELATED APPLICATIONS

The present application is based upon and claims the benefit of priority to Japanese Patent Application No. 2016-208878, filed Oct. 25, 2016, the entire contents of which are incorporated herein by reference.

BACKGROUND OF THE INVENTION

Field of the Invention

The present invention relates to a printed wiring board having a cavity in which conductor pads are exposed and relates to a method for manufacturing the printed wiring board.

Description of Background Art

Japanese Translation of PCT International Application Publication No. 2013-520007 describes a printed circuit board having a cavity region. The printed circuit board has a base circuit board in which a metal layer is formed on both sides of an insulating material, and has an external circuit layer formed on both sides of the base circuit board. The cavity region is defined by irradiating a laser beam from a surface of the external circuit layer. The laser beam is irradiated toward a laser stopper stepped portion in a circuit pattern on a surface of the base circuit board. The entire contents of this publication are incorporated herein by reference.

SUMMARY OF THE INVENTION

According to one aspect of the present invention, a printed wiring board includes a laminate having a first surface and a second surface, conductor posts formed on the second surface of the laminate on the opposite side with respect to the first surface of the laminate, and a mold resin layer formed on the second surface of the laminate such that the conductor posts are formed in the mold resin layer covering side surfaces of the conductor posts. The laminate includes conductor layers and one or more resin insulating layers, the conductor layers includes a first conductor layer formed such that the first conductor layer is embedded in a resin insulating layer forming the second surface of the laminate and has one surface exposed on a second surface side of the laminate, the first conductor layer includes first conductor pads and second conductor pads formed such that the second conductor pads are formed on an outer peripheral side of the first conductor pads, the mold resin layer has a cavity exposing the first conductor pads, the conductor posts are formed on the second conductor pads respectively on the second surface side of the laminate, and the first conductor layer includes fan-out wirings extending from inside the cavity to outside the cavity.

According to another aspect of the present invention, a method for manufacturing a printed wiring board includes forming a laminate having a first surface and a second surface, forming conductor posts such that the conductor posts are positioned on the second surface of the laminate on the opposite side with respect to the first surface of the laminate, and forming a mold resin layer on the second surface of the laminate such that the conductor posts are positioned in the mold resin layer covering side surfaces of the conductor posts. The forming of the laminate includes laminating conductor layers and one or more resin insulating layer, forming the conductor layers including a first conductor layer such that the first conductor layer is embedded in a resin insulating layer forming the second surface of the laminate and has one surface exposed on a second surface side of the laminate, and forming the first conductor layer including first conductor pads and second conductor pads such that the second conductor pads are formed on an outer peripheral side of the first conductor pads, the forming of the mold resin layer includes forming a cavity in the mold resin layer such that the cavity exposes the first conductor pads on the second surface of the laminate, and the forming of the conductor posts includes forming the conductor posts on the second conductor pads respectively on the second surface side of the laminate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2 is a plan view of the printed wiring board illustrated in FIG. 1;

DETAILED DESCRIPTION OF THE EMBODIMENTS

Figure 1:
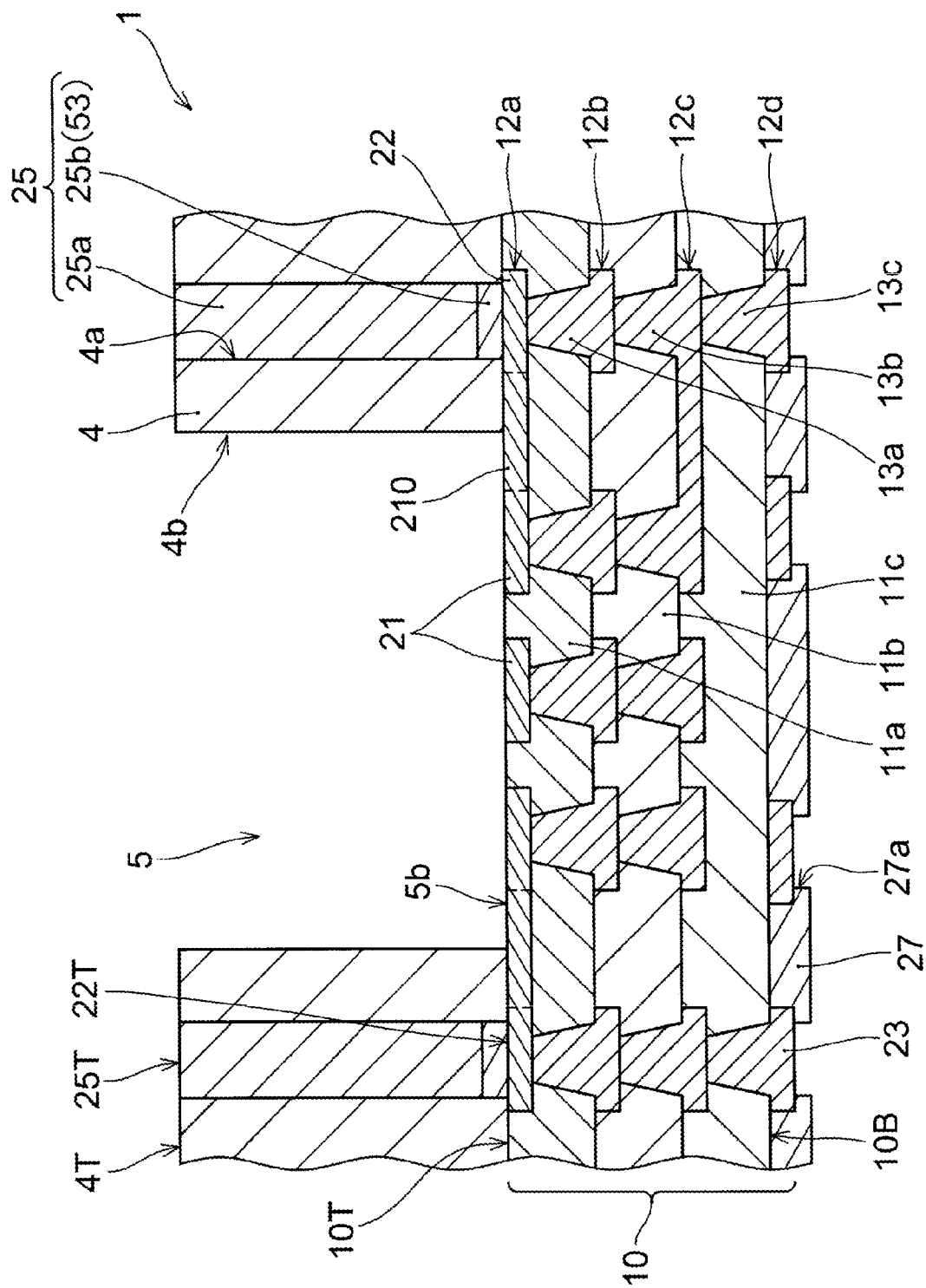
FIG. 1 is a cross-sectional view of an example of a printed wiring board of an embodiment of the present invention.

Embodiments will now be described with reference to the accompanying drawings, wherein like reference numerals designate corresponding or identical elements throughout the various drawings.

A printed wiring board of an embodiment of the present invention is described with reference to the drawings. FIGS. 1 and 2 respectively illustrate a cross-sectional view and a plan view of an example of a printed wiring board 1 of the embodiment. FIG. 1 is a cross-sectional view at a position indicated by a line I-I in FIG. 2. The printed wiring board 1 includes a laminate 10, a mold resin layer 4, and a cavity (recess) 5, the laminate 10 including conductor layers and resin insulating layers and having a first surface (10B), which is a surface of a laminated resin insulating layer, and a second surface (10T) that is on an opposite side of the first surface (10B), the mold resin layer 4 being formed on the second surface (10T) of the laminate 10, and the cavity (recess) 5 exposing first conductor pads 21 to be connected to an electronic component. The laminate 10 includes one or more resin insulating layers (in the example of FIG. 1, a first resin insulating layer (11a), a second resin insulating layer (11b), and a third resin insulating layer (11c)) and two or more conductor layers (in the example of FIG. 1, a first conductor layer (12a), a second conductor layer (12b), a third conductor layer (12c), and a fourth conductor layer (12d)) that are laminated with the resin insulating layers sandwiched therebetween. The first surface (10B) of the laminate 10 is formed from a surface of a resin insulating layer (the third resin insulating layer (11c) in the example of FIG. 1) exposed on one side in a lamination direction of the laminate 10. And, the second surface (10T) of the laminate 10 is formed from a surface of a resin insulating layer (the first resin insulating layer (11a) in the example of FIG. 1) exposed on the other side in the lamination direction of the laminate 10. The laminate 10 has the multiple first conductor pads 21 that are formed in a center portion of the second surface (10T) and multiple second conductor pads 22 that are formed on an outer peripheral side of the multiple first conductor pads 21 on the second surface (10T), and multiple third conductor pads 23 that are formed on the first surface (10B). The first conductor layer (12a) includes the first conductor pads 21 and the second conductor pads 22. In the example of FIG. 1, in addition to the first conductor pads 21 and the second conductor pads 22, the first conductor layer (12a) includes conductor patterns 210. The first conductor pads 21 are connected to, for example, an electronic component (not illustrated in the drawings) such as a semiconductor element. Examples of the electronic component include a semiconductor element, a passive element (such as a capacitor or a resistor), an interposer having a wiring layer, a semiconductor element having a rewiring layer, a WLP (Wafer Level Packages), and the like. The second conductor pads 22 are connected to, for example, an external wiring board, a relatively large electronic component (not illustrated in the drawings) or the like via conductor posts 25 that are respectively formed on the second conductor pads 22. Examples of the external wiring board include a motherboard, a wiring board of a package of an external electronic component, and the like. The third conductor pads 23 are connected to, for example, an electrical circuit such as an external motherboard (not illustrated in the drawings).

FIG. 2 illustrates a surface (4T) side of the mold resin layer 4 of the printed wiring board 1 of the embodiment. The first conductor pads 21 are exposed in the cavity 5. As illustrated in FIG. 2, in the present embodiment, the first conductor layer (12a) does not include conductor patterns extending along a peripheral edge of the cavity 5. Therefore, the conductor patterns 210 connecting the first conductor pads 21 and the second conductor pads can be formed in the first conductor layer (12a). That is, the first conductor pads 21 and the second conductor pads 22 can be connected via short paths.

Here, "the conductor patterns extending along the peripheral edge of the cavity 5" include "conductor patterns extending along the peripheral edge of the cavity 5" that are integrally formed with a so-called solid pattern formed on an entire surface of a predetermined region. Further, "the conductor patterns extending along the peripheral edge of the cavity 5" include both conductor patterns that continuously extend along the peripheral edge of the cavity 5 and conductor patterns that intermittently extend and include one or multiple gap portions along the peripheral edge of the cavity 5.

A solder resist layer 27 is formed on the first surface (10B) of the laminate 10. The solder resist layer 27 has multiple openings (27a) that respectively expose the third conductor pads 23. As illustrated in FIG. 1, the third conductor pads 23 are formed on the first surface (10B) without being embedded in the third resin insulating layer (11c) that forms the first surface (10B) of the laminate 10. That is, the third conductor pads 23 are formed protruding on the first surface (10B). An outer peripheral portion of each of the third conductor pads 23 is covered by the solder resist layer 27. It is also possible that the openings (27a) are provided to each have a size such that an entire surface of each of the third conductor pads 23 is exposed. The third conductor pads 23 may be formed at any positions required for connecting to an external electrical circuit or the like. Since the solder resist layer 27 covers edge portions of the third conductor pads 23, in the connection between the third conductor pads 23 and an external electrical circuit, occurrence of a short-circuit defect due to solder or the like between the third conductor pads 23 is suppressed. The solder resist layer 27 can be formed of, for example, a photosensitive epoxy resin or polyimide resin.

The laminate 10 has a laminated structure similar to that of a so-called build-up part in a build-up wiring board. In the example of FIG. 1, from the second surface (10T) side of the laminate 10 toward the first surface (10B) side, sequentially, the first conductor layer (12a), the first resin insulating layer (11a), the second conductor layer (12b), the second resin insulating layer (11b), the third conductor layer (12c), the third resin insulating layer (11c), and the fourth conductor layer (12d) are laminated. A surface of the first resin insulating layer (11a) on an opposite side of the second conductor layer (12b) side forms the second surface (10T) of the laminate 10. The first conductor layer (12a) includes the multiple first conductor pads 21 formed on the center side of the second surface (10T) of the laminate 10 and the multiple second conductor pads 22 formed on the outer peripheral side of the second surface (10T).

The first conductor layer (12a) is embedded in the first resin insulating layer (11a) with one surface of the first conductor layer (12a) exposed on the second surface (10T) of the laminate 10. That is, the first conductor pads 21 and the second conductor pads 22 are embedded in the first resin insulating layer (11a), and a surface of each of the first conductor pads 21 and the second conductor pads 22 on the second surface (10T) side is exposed on the second surface (10T) side of the laminate 10. In this way, embedding the first conductor layer (12a) in the first resin insulating layer (11a) contributes to reduction in thickness of the printed wiring board. Further, adhesion between the first conductor layer (12a) and the first resin insulating layer (11a) is improved. In the example of FIG. 1, the surfaces of the first conductor pads 21 and the second conductor pads 22 on the second surface (10T) side are substantially flush with the second surface (10T) of the laminate 10. Side surfaces of the first conductor pads 21 and the second conductor pads 22 are covered by the first resin insulating layer (11a). Contact due to a bonding material such as solder between adjacent conductor pads is unlikely to occur. Even when the conductor pads are fainted at a fine pitch, a short-circuit defect is unlikely to occur.

In the example illustrated in FIG. 1, the laminate 10 include three resin insulating layers and a total of four conductor layers that are respectively forming on surfaces of the resin insulating layers. That is, FIG. 1 illustrates an example of so-called four-layered laminate 10. However, the number of the resin insulating layers and the number of the conductor layers are not limited to the example of FIG. 1, and can be appropriately selected according to a structure of a circuit formed in the printed wiring board 1. The laminate 10 may include only one resin insulating layer and conductor layers that are respectively provided on both sides the resin insulating layer, or may include more than four conductor layers. By allowing the laminate 10 to include more conductor layers, without increasing a planar size of the printed wiring board 1, a larger and more complex electrical circuit can be formed in the printed wiring board 1.

First via conductors (13a), second via conductors (13b), and third via conductors (13c) respectively connect between the first conductor layer (12a) and the second conductor layer (12b), between the second conductor layer (12b) and the third conductor layer (12c), and between the third conductor layer (12c) and the fourth conductor layer (12d). The first via conductors (13a), the second via conductors (13b), and the third via conductors (13c) are respectively formed in the first resin insulating layer (11a), the second resin insulating layer (11b), and the third resin insulating layer (11c). As will be described later, the via conductors are respectively formed in conduction holes that are each formed, for example, by irradiating a laser beam to one side of a respective resin insulating layer. The conduction holes each have a diameter that is larger on a laser irradiation side and become smaller on a deep side (opposite side of the laser irradiation side). In the example illustrated in FIG. 1, since the laser beam is irradiated from a lower side in the drawing, the diameter (width) on the lower side of each of the conduction holes is larger and the diameter (width) on an upper side is smaller. Therefore, the via conductors that are respectively formed in the conduction holes also each have a width (diameter) that is larger on a lower side and is smaller on an upper side. In the example illustrated in FIG. 1, the via conductors are each formed in a tapered shape that is gradually reduced in diameter from the first surface (10B) toward the second surface (10T) of the laminate 10. The reduced diameter sides of the tapered shapes of the first via conductors (13a) are respectively connected to the first conductor pads 21 or the second conductor pads 22 of the first conductor layer (12a). Therefore, the diameters of the first conductor pads 21 and the second conductor pads 22 in the first conductor layer (12a) can be reduced. Since gaps between the conductor pads are widened, occurrence of a short-circuit defect is suppressed. The term "reduced in diameter" is used for convenience only. A cross-sectional shape of each of the via conductors is not limited to a circle or an ellipse, but may also be a rectangle. The term "reduced in diameter" means that a cross-sectional area decreases. End surfaces of the third via conductors (13c) on the first surface (10B) side of the laminate 10 are connected to the third conductor pads 23 of the fourth conductor layer (12d). Some of the first, second and third via conductors (13a, 13b, 13c), such as those via conductors on a left edge side and a right edge side in FIG. 1, may be formed at overlapping positions in a plan view to form so-called stack vias. Thereby, an external electronic component connected to the first conductor pads 21, and an external electrical circuit connected to the second conductor pads 22 via the conductor posts 25, can be electrically connected to an external motherboard or the like on the third conductor pads 23 side via a short path.

For example, as in the example of FIG. 1, when the laminate 10 includes multiple resin insulating layers, preferably, the resin insulating layers (the first, second and third resin insulating layers (11a, 11b, 11c)) are formed of the same resin material. However, it is also possible that mutually different resin materials are used. Materials of the resin insulating layers are not particularly limited as long as the materials are insulating and each have adhesion to a conductor layer, an appropriate thermal expansion coefficient, and the like. The resin insulating layers can each be formed, for example, by applying heat and pressure to a resin material such as a film for interlayer insulation. Or, the material of each of the resin insulating layers may be a prepreg in a semi-cured state obtained by impregnating a core material such as glass fiber with a resin material. Warping due to a difference in thermal expansion coefficient with respect to the electronic component can be easily prevented. A preferred example of the resin material is an epoxy resin. The epoxy resin may contain inorganic filler such as silica ($SiO_2$) or alumina. The first-third resin insulating layers (11a, 11b, 11c) each have a thickness of, for example, 3 μm or more and 25 μm or less.

The conductor layers (first, second, third and fourth conductor layers (12a, 12b, 12c, 12d)) each have conductor patterns patterned into predetermined shapes such as conductor pads and wirings. As will be described later, the conductor layers are each formed, for example, by electrolytic plating. By using a so-called semi-additive method, fine patterns are precisely formed. As a result, in particular, requirements for a high density and a fine pitch are satisfied. An example of a material of the conductor layers formed by electrolytic plating is copper. The material of the conductor layers may also be other good conductive metals such as nickel. Preferably, the via conductors connecting the conductor patterns are also formed of the same material as the first-fourth conductor layers (12a, 12b, 12c, 12d). The first-fourth conductor layers (12a, 12b, 12c, 12d) each have a thickness of, for example, 3 μm or more and 20 μm or less.

The mold resin layer 4 is formed on the second surface (10T) of the laminate 10, and has the cavity 5 that exposes the first conductor pads 21 on a bottom surface and openings (4a) that each expose a portion of a second conductor pad 22. The conductor posts 25 are respectively formed in the openings (4a) of the mold resin layer 4 so as to be respectively in contact with the second conductor pads 22. The conductor posts 25 are respectively formed on exposed surfaces of the second conductor pads 22 on the second surface (10T) side of the laminate 10. Side surfaces of the conductor posts 25 are covered by the mold resin layer 4. In the example of FIG. 1, the conductor posts 25 each include a metal foil layer (25b) covering an upper surface (22T) of a second conductor pad 22, and a plating film layer (25a) formed on the metal foil layer (25b) by electrolytic plating. The metal foil layer (25b) is formed of, for example, a metal foil such as a copper foil or a nickel foil. The plating film layer (25a) can be preferably formed of the same material as the metal foil layer (25b) by electrolytic plating using the metal foil layer (25b) as a seed layer. The plating film layer (25a) is, for example, a copper plating film layer. The conductor posts 25 each have a height of 50 μm or more and 150 μm or less. The height of the conductor posts 25 is set according to a thickness of the mold resin layer 4. That is, the height of the conductor posts 25 can be set according to a depth of the cavity 5. The conductor posts 25 each have an end surface (25T) on an opposite side of the second conductor pad 22 side. In the example of FIG. 1, the end surfaces (25T) of the conductor posts 25 are substantially flush with the surface (4T) of the mold resin layer 4. An external wiring board or the like is mounted on the end surfaces (25T) of the conductor posts 25 via a bonding material such as solder.

A material of the mold resin layer 4 is not particularly limited as long as the material has a good insulating property. An example of the material is an epoxy resin. The material of the mold resin layer 4 may contain inorganic filler that contains $SiO_2$ or the like. An amount of the inorganic filler contained in the material is, for example, 60 mass % or more and 95 mass % or less. The mold resin layer 4 has a thickness of, for example, 50 μm or more and 150 μm or less. This thickness is substantially equal to the depth of the cavity 5. The depth of the cavity 5 is a distance from the surface (4T) of the mold resin layer 4 to a surface of a first conductor pad 21. This distance, for example, as will be described later, can be easily adjusted by changing a thickness of a dummy member 7 (see FIG. 3N) that is used when the mold resin layer 4 is forming. The depth of the cavity 5 can be arbitrarily selected depending on a thickness or the like of an electronic component to be accommodated in the cavity 5.

An electronic component that is mounted on the printed wiring board 1 is preferably accommodated in the cavity 5. The cavity 5 exposes the first conductor pads 21 on a bottom surface (5*b*) and has an opening on the surface (4T) of the mold resin layer 4. For example, an electronic component can be connected to the printed wiring board 1 via the first conductor pads 21.

In the example illustrated in FIG. 1, an inner wall surface of the cavity 5 of the printed wiring board 1 is formed by an inner wall surface of a through hole (4*b*) of the mold resin layer 4. The inner wall surface of the through hole (4*b*) is substantially parallel to a thickness direction of the printed wiring board 1. The cavity 5 surrounded by such an inner wall surface is preferable from a point of view of miniaturization of the printed wiring board as compared to a cavity having a shape tapering toward the bottom surface (5*b*) side or the opening side. This is because an area larger than an area effective for arranging a component in the cavity 5 is not occupied on either the bottom surface (5*b*) side or the opening side. Further, the side surfaces of the conductor posts 25 are not exposed on the inner wall surface of the cavity 5. A risk of unintended contact with an electronic component (not illustrated in the drawings) accommodated in the cavity 5 is reduced. An exposed surface of the first resin insulating layer (11*a*) that forms the second surface (10T) of the laminate 10 and an exposed surface of the first conductor layer (12*a*) on the second surface (10T) side form the bottom surface (5*b*) of the cavity 5.

As illustrated in FIG. 1, the conductor patterns 210 connect the first conductor pads 21 to the second conductor pads 22. The first conductor pads 21 are exposed in the bottom surface (5*b*) of the cavity 5. Therefore, a surface of a portion of each of the conductor patterns 210 connecting to the first conductor pads 21 in the cavity 5 is also exposed in the bottom surface (5*b*) of the cavity 5. That is, the conductor patterns 210 extend from an inner side of the cavity 5 to an outer side of the cavity 5. The conductor patterns 210 are so-called fan-out wirings that are provided for electrically extending electrodes of an electronic component mounted in the cavity 5 to outside of the cavity 5. As illustrated in FIG. 1, by providing the fan-out wirings in the first conductor layer (12*a*), the first conductor pads 21 can be directly connected to the second conductor pads 22 and/or other conductor patterns positioned on the outside of the cavity 5 without going through other conductor layers or via conductors. The electronic component mounted in the cavity 5 and an external electrical circuit can be electrically connected via a short path. Electrical characteristics of an electrical device using the printed wiring board 1 can be improved. Reduction in height of the printed wiring board 1 including the electronic component can be achieved.

As illustrated in FIG. 2, the first conductor pads 21 are formed substantially at the center of the printed wiring board 1. That is, in FIG. 2, the cavity 5, in which the first conductor pads 21 are exposed on the bottom surface (5*b*), is formed at a substantially central position of the printed wiring board 1. This facilitates mounting an electronic component in the cavity 5. However, it is also possible that the cavity 5 is provided at a place other than substantially the center of the printed wiring board 1. Further, FIG. 2 illustrates an example in which one cavity 5 is provided. However, it is also possible that multiple cavities 5 are separately provided. As illustrated in FIG. 2, the end surfaces (25T) of the conductor posts 25 are exposed on the surface (4T) of the mold resin layer 4 on an outer peripheral side of the cavity 5 of the printed wiring board 1.

On the bottom surface (5*b*) of the cavity 5, a portion of each of the conductor patterns 210 connecting to the first conductor pads 21 is also exposed and forms a fan-out wiring. In FIG. 2, for simplicity of illustration, only nine first conductor pads 21 are illustrated. However, in practice, a much larger number of first conductor pads 21 can be formed. Electrodes of an electronic component mounted in the cavity 5 are connected to the first conductor pads 21. The number and arrangement of the first conductor pads 21 can be suitably selected according to the number and arrangement of electrodes of an electronic component to be mounted in the cavity 5. Fan-out wirings can be formed according to the number and arrangement of the first conductor pads 21. Arrangement and a size of the cavity 5 also can be suitably selected according to an electronic component mounted in the cavity 5. In the example of FIG. 2, the through hole (4*b*) of the mold resin layer 4 is formed in a quadrangular planar shape. Therefore, the cavity 5 also can have a quadrangular planar shape. However, the planar shapes of the through hole (4*b*) and the cavity 5 are not limited to this, and may be shapes of polygons or circles other than quadrangles. The through hole (4*b*) and the cavity 5 can be formed to have any planar shapes depending on a shape or the like of an electronic component to be accommodated in the cavity 5.

In FIG. 2, for simplicity of illustration, the multiple conductor posts 25 are formed in one row around the cavity 5. However, the number of the conductor posts 25 and the positions at which the conductor posts 25 are formed are not limited to the example of FIG. 2. An arbitrary number of conductor posts 25 may be formed at any positions depending on an external wiring board to be connected to the printed wiring board 1. Further, planar shapes of the conductor posts 25 and the first conductor pads 21 also are not limited to circular shapes as illustrated in FIG. 2, and can be any planar shapes such as polygonal shapes.

Next, an example of a method for manufacturing a printed wiring board of the embodiment is described with reference to FIG. 3A-3P using the printed wiring board 1 illustrated in FIG. 1 as an example.

As illustrated in FIG. 3A, a base plate 51 is prepared, a metal foil 53 being provided on each surface of the base plate 51. The metal foil 53 has a carrier metal foil 52 adhered to one side of the metal foil 53. A surface of the carrier metal foil 52 on an opposite side of the metal foil 53 is bonded to a surface of the base plate 51 by thermocompression bonding. The metal foil 53 and the carrier metal foil 52 are adhered to each other by, for example, a separable adhesive such as a thermoplastic adhesive. It is also possible that the metal foil 53 and the carrier metal foil 52 are adhered to each other only in a margin portion near an outer periphery. For example, a prepreg obtained by impregnating a core material such as a glass fiber with a resin material such as an epoxy resin is used for the base plate 51. The prepreg can be fully cured when being thermocompression-bonded to the carrier metal foil 52. It is also possible that a metal plate such as copper plate is used for the base plate 51. Further, it is also possible that a double-sided copper-clad laminated plate is used as the base plate 51 having the carrier metal foil 52. The metal foil 53 and the carrier metal foil 52 are preferably copper foils. Other metal foils such as a nickel foil may also be used. The metal foil 53 has a thickness of, for example, 3 μm or more and 10 μm or less. In FIG. 3A-3P, it is not intended to illustrate exact ratios of thicknesses of the structural elements.

Figure 3B:
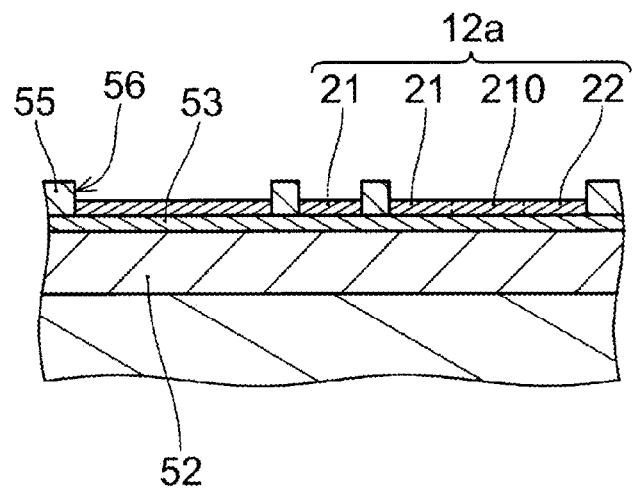
FIG. 3A-3P illustrate a method for manufacturing a printed wiring board according to an embodiment of the present invention.

In the example of FIG. 3A, the metal foil 53 is provided on both one surface (51a) and the other surface (51b), which is on an opposite side of the one surface (51a), of the base plate 51. Laminates 10 (see FIG. 1) can be respectively simultaneously formed on both front and back sides of the base plate 51. The printed wiring board 1 can be efficiently manufactured. However, the metal foil 53 is not necessarily required to be provided on both front and back sides of the base plate 51. In FIG. 3B-3I and the following description, illustration and description with respect to the other surface (51b) side of the base plate 51 are omitted. Further, in FIG. 3B-3H, only one laminate 10 on the one surface (51a) side of the base plate 51 is illustrated. However, it is also possible that multiple laminates 10 are formed on each of the one surface (51a) side and the other surface (51b) side of the base plate 51.

In the method for manufacturing the printed wiring board of the embodiment, the laminate 10 is formed from the first conductor layer (12a) side. The first conductor layer (12a) is formed on a surface of the metal foil 53 on an opposite side of the carrier copper foil 52. First, as illustrated in FIG. 3B, a plating resist layer 55 for forming the first conductor layer (12a) is formed on the metal foil 53. In the plating resist layer 55, openings 56 are respectively formed in formation regions of the conductor patterns of the first conductor layer (12a), for example, using a photolithography technology. The metal foil 53 is exposed at bottom surfaces of the openings 56. Then, by electrolytic plating using the metal foil 53 as a seed layer, an electrolytic plating film is formed in the openings 56. The multiple first and second conductor pads (21, 22) are respectively formed in the multiple openings 56. Further, since the first conductor layer (12a) has the conductor patterns 210 connecting the first conductor pads 21 and the second conductor pads 22, openings 56 are also provided in the plating resist layer 55 in formation regions of the conductor patterns 210, and conductor films are respectively forming in the openings 56. As a result, the first conductor layer (12a) is formed that includes the multiple first conductor pads 21, the multiple second conductor pads 22 and the fan-out wirings (the conductor patterns 210), which are formed from the electrolytic plating films in the openings 56, the fan-out wirings (the conductor patterns 210) each having one end connected to a first conductor pad 21. The conductor patterns 210 are formed such that, even after the cavity 5 (see FIG. 3P) is formed in a subsequent process, a portion of each of the conductor patterns 210 is covered by the mold resin layer 4 (see FIG. 3P). Further, as described above with reference to FIG. 2, the first conductor layer (12a) is formed such that a region corresponding to the peripheral edge of the cavity 5 does not contain conductor patterns extending along the peripheral edge of the cavity 5. The second conductor pads 22 are formed on the metal foil 53 on an outer peripheral side of the first conductor pads 21. Since etching is not used, the first conductor pads 21 and the like can be formed at a fine pitch in the first conductor layer (12a). After the formation of the first conductor layer (12a), the plating resist layer 55 is removed. It is also possible that the first conductor layer (12a) is formed by electroless plating. The first conductor layer (12a) is preferably formed of the same material as the metal foil 53.

Figure 3C:
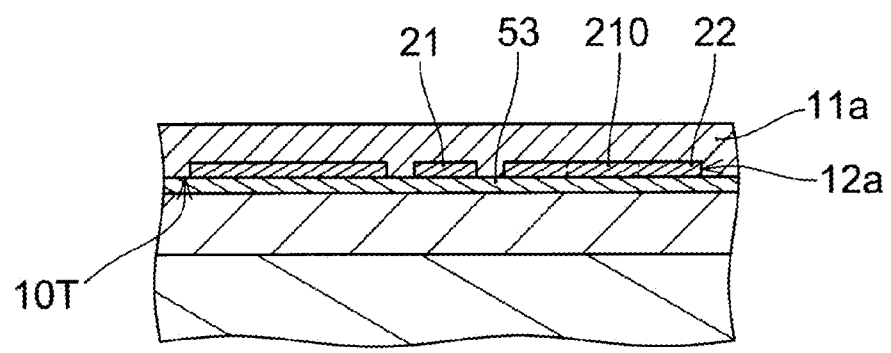

As illustrated in FIG. 3C-3G, the laminate 10 is formed by alternately laminating the resin insulating layers and the conductor layers on the first conductor layer (12a). A common method for manufacturing a build-up wiring board can be used. First, as illustrated in FIG. 3C, the first resin insulating layer (11a) covering the first conductor layer (12a) is formed on the metal foil 53. The first resin insulating layer (11a) is formed, for example, by thermocompression bonding a film-like epoxy resin or the like on the first conductor layer (12a) and on exposed portions of the metal foil 53. The first resin insulating layer (11a) forms the second surface (10T) of the laminate 10 (see FIG. 1). The first resin insulating layer (11a) is formed so as to cover the first conductor pads 21, the second conductor pads 22 and the conductor patterns 210 except their surfaces on the metal foil 53 side.

Figure 3D:
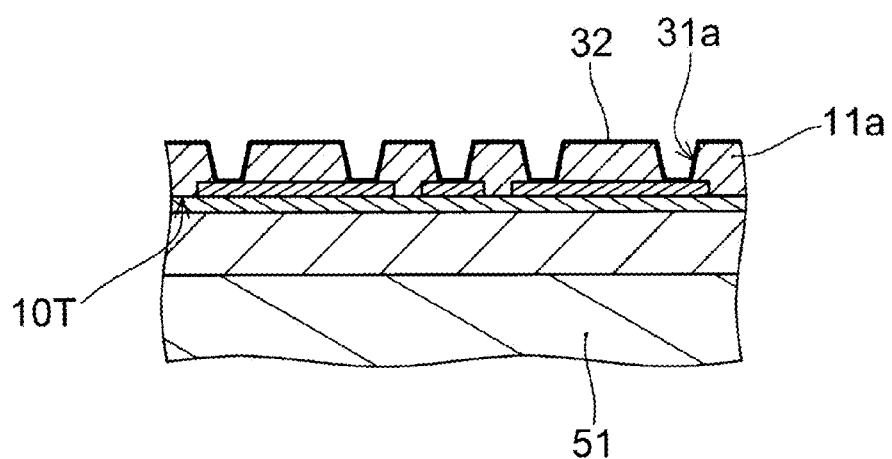

As illustrated in FIG. 3D, conduction holes (31a) penetrating the first resin insulating layer (11a) are respectively formed at formation locations of the first via conductors (13a) (see FIG. 1). For example, $CO_2$ laser is irradiated to predetermined positions on the first resin insulating layer (11a). By irradiating laser to the first resin insulating layer (11a) from an opposite side of the base plate 51, the conduction holes (31a) are formed each having a tapered shape that is gradually reduced in diameter toward the second surface (10T) side. Subsequently, a metal layer 32 is formed in the conduction holes (31a) and on a surface of the first resin insulating layer (11a) by electroless plating or sputtering or the like. It is also possible that the metal layer 32 is formed by sputtering, vacuum deposition or the like. A material of the metal layer 32 is also preferably copper, but is not limited to copper. For example, the metal layer 32 may be a Ti/Cr sputtered layer formed by sputtering. The metal layer 32 has a thickness of about 0.05 μm or more and 1.0 μM or less.

Figure 3E:
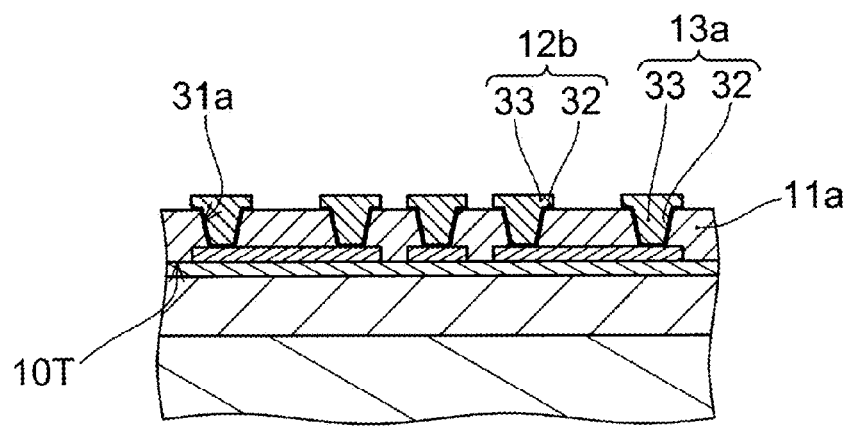

As illustrated in FIG. 3E, an electrolytic plating film 33 is formed by electrolytic plating using the metal layer 32 as a seed layer. The electrolytic plating film 33 is formed using a so-called pattern plating method or the like using a plating resist (not illustrated in the drawings) that has predetermined openings at formation regions of the conductor patterns of the second conductor layer (12b) and at positions of the conduction holes (31a). After the formation of the electrolytic plating film 33, the plating resist (not illustrated in the drawings) is removed. Then, portions of the metal layer 32 that are exposed by the removal of the plating resist and are not covered by the electrolytic plating film 33 are removed by etching. As a result, the second conductor layer (12b) is formed by the metal layer 32 on the first resin insulating layer (11a) and the electrolytic plating film 33 on the first resin insulating layer (11a) and on the conduction holes (31a). Further, the first via conductors (13a) are formed by the metal layer 32 and the electrolytic plating film 33 in the conduction holes (31a). Since the conduction holes (31a) each have a tapered shape that is gradually reduced in diameter toward the second surface (10T) side, along the shapes of the conduction holes (31a), the first via conductors (13a) each having a shape that is gradually reduced in diameter toward the second surface (10T) side can be formed. Thereafter, the metal layer 32 and the electrolytic plating film 33 are not distinguished from each other and are collectively referred to as the second conductor layer (12b).

Figure 3F:
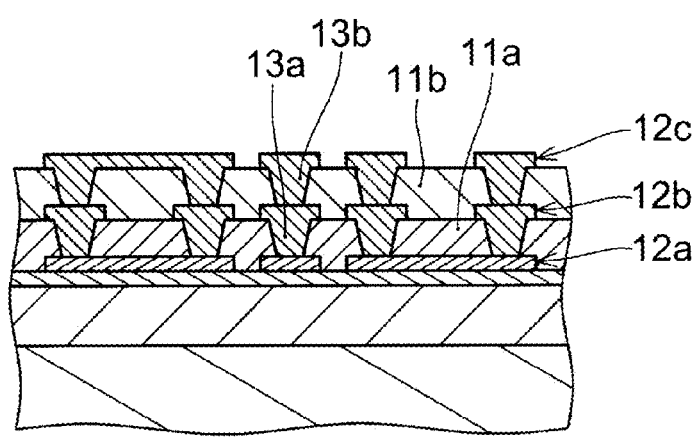

As illustrated in FIG. 3F, by repeating processes similar to the processes of FIG. 3C-3E, the second resin insulating layer (11b), the third conductor layer (12c), and the second via conductors (13b) are formed on the second conductor layer (12b) and the first resin insulating layer (11a), the second via conductors (13b) each having a shape that is gradually reduced in diameter toward the second surface (10T) side. In FIG. 3F, the second conductor layer (12b) and the third conductor layer (12c) are each simplified as one layer in the illustration. Also in FIG. 3G-3P, the conductor layers are similarly simplified in the illustration.

Figure 3G:
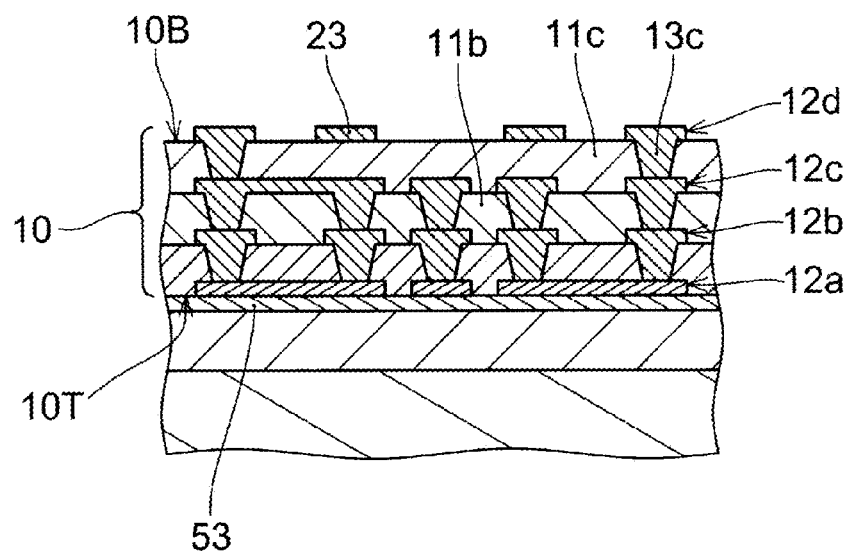

Further, as illustrated in FIG. 3G, by repeating processes similar to the processes of FIG. 3C-3E, the third resin insulating layer (11c), the fourth conductor layer (12d) and the third via conductors (13c) are formed on the second resin insulating layer (11b) and the third conductor layer (12c), the third via conductors (13c) each having a shape that is gradually reduced in diameter toward the second surface (10T) side.

By the above formation of the resin insulating layers and the conductor layers, the laminate 10 is formed on the metal foil 53. The laminate 10 includes the first conductor layer (12a) formed on the metal foil 53, and has the second surface (10T) on the metal foil 53 side and the first surface (10B) on an opposite side of the second surface (10T). The multiple third conductor pads 23 are formed in the fourth conductor layer (12d) positioned on the most first surface (10B) side. The multiple third conductor pads 23 are formed protruding on the first surface (10B). When the printed wiring board 1 has a different number of conductor layers from the laminate 10 illustrated in FIG. 1, the number of repetitions of the processes illustrated in FIG. 3C-3E is appropriately adjusted. For example, when a printed wiring board having only one resin insulating layer and conductor layers provided on both sides of the resin insulating layer is manufactured, the processes of FIG. 3C-3E are not repeated.

Materials for the first-fourth conductor layers (12a-12d) and the first-third via conductors (13a-13c) are not particularly limited as long as the materials have good conductivity and allow the first-fourth conductor layers (12a-12d) and the first-third via conductors (13a-13c) to be easily formed by plating and can be easily removed by etching. Examples of the materials for the conductor layers and the via conductors include copper, nickel and the like, and copper is preferably used. As described above, materials for the first-third resin insulating layers (11a-11c) are not particularly limited as long as the materials have good insulating properties and the like. In addition to the epoxy resin described above, bismaleimide triazine resin (BT resin), phenol resin and the like can be used. A resin material forming the resin insulating layers may contain inorganic filler such as silica.

Figure 3H:
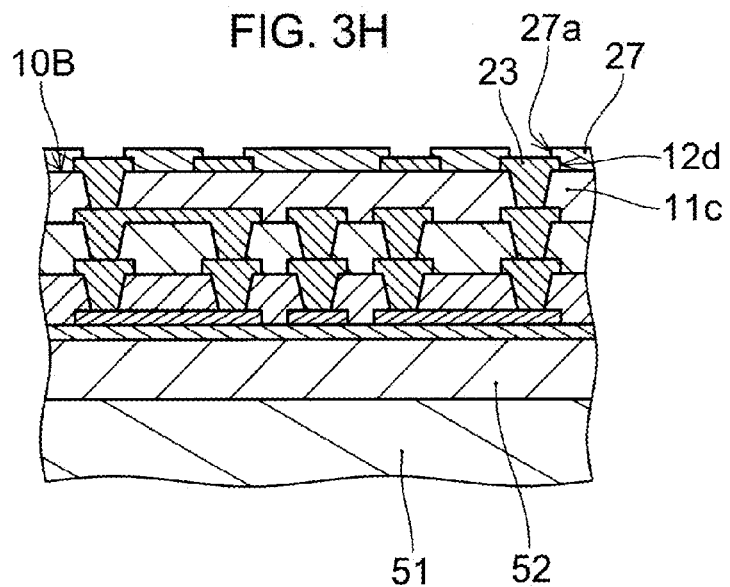

As illustrated in FIG. 3H, the solder resist layer 27 having the openings (27a) on the third conductor pads 23 is formed. The solder resist layer 27 is formed on the surface of the third resin insulating layer (11c) exposed without being covered by the fourth conductor layer (12d) and on outer edge portions of the third conductor pads 23. For example, a layer of a photosensitive epoxy resin is formed on the fourth conductor layer (12d) and on the third resin insulating layer (11c) by printing, spray coating or the like, and the openings (27a) are formed using a photolithography technology. Although not illustrated in the drawings, in order to protect the third conductor pads 23 exposed in the openings (27a) in a subsequent process, a protective film may further be provided on an outermost layer on the first surface (10B) side of the laminate 10. The third conductor pads 23 are protected, for example, from etching or the like in the process of FIG. 3L. In addition to or in place of the protective film (not illustrated in the drawings), a support plate (not illustrated in the drawings) supporting the laminate 10 may be attached to the solder resist layer 27. Handling of the printed wiring board 1 during a manufacturing process is facilitated. After the printed wiring board 1 is completed, the protective film or the support plate (not illustrated in the drawings) can be peeled off.

Figure 3I:
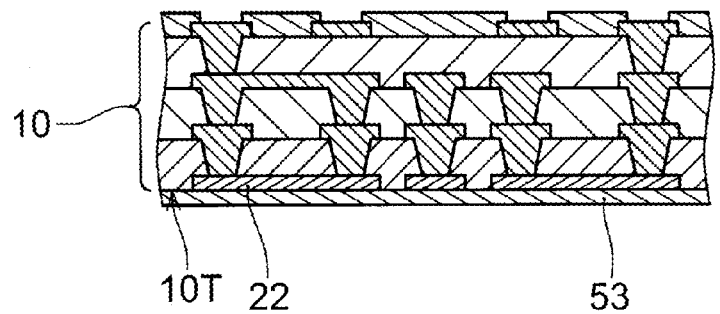

Next, as illustrated in FIG. 3I, the base plate 51 and the laminate 10 are separated from each other, and the base plate 51 is removed. Specifically, the carrier metal foil 52 bonded to the base plate 51 is separated from the metal foil 53. That is, the base plate 51 and the laminate 10 are separated from each other such that the metal foil 53 remains on the second surface (10T) of the laminate 10. For example, the thermoplastic adhesive that adheres the metal foil 53 and the carrier metal foil 52 to each other is softened by heating, and, in this state, the metal foil 53 and the carrier metal foil 52 are pulled apart. In the case where the conductor layers and the like are formed on both sides of the base plate 51, by removing the base plate 51 and the carrier copper foil 52, two laminates 10 are obtained. When the carrier metal foil 52 and the metal foil 53 are adhered to each other only in a peripheral margin portion, the two can be easily separated from each other by cutting an inner side of the adhering portion. Further, it is also possible to separate the base plate 51 and the laminate 10 from each other by simply pulling the two in mutually opposite directions. As illustrated in FIG. 3I, by the separation of the carrier metal foil 52 and the metal foil 53 from each other, the metal foil 53 is exposed on the entire surface on the second surface (10T) side of the laminate 10.

Figure 3J:
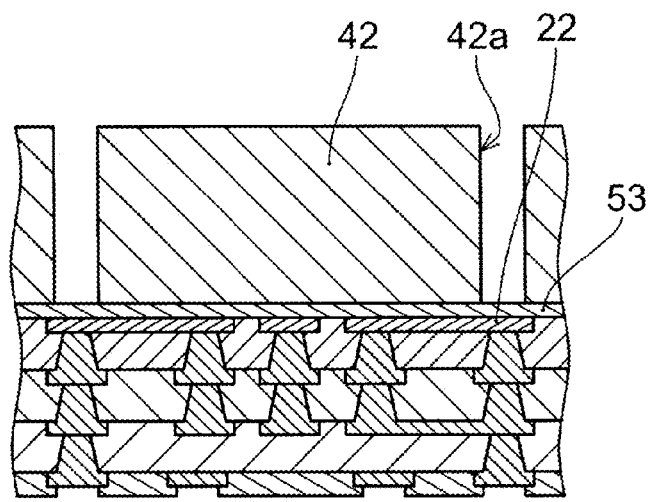
Figure 3K:
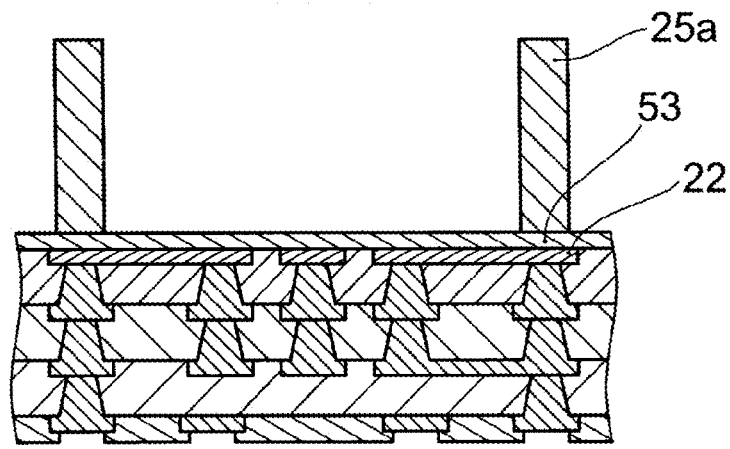

Next, the conductor posts 25 are respectively formed on the second via conductors 22. As illustrated in FIG. 3J, a plating resist 42 for forming the conductor posts is formed on a surface of the metal foil 53 exposed due to the removal of the base plate 51. The plating resist layer 42 can be formed to have a thickness substantially equal to or slightly larger than a length of each of the conductor posts 25. Openings (42a) are provided in the plating resist 42 at formation positions of the conductor posts 25, that is, on the second conductor pads 22, for example, using a photolithography technology. The metal foil 53 is exposed at bottom surfaces of the openings (42a). Since a width of each of the conductor posts 25 is smaller than the width of each of the second conductor pads 22 in the printed wiring board 1 of FIG. 1, the openings (42a) are formed to each have an opening width smaller than the width of each of the second conductor pads 22. Subsequently, a plating film is formed in each of the openings (42a) by electrolytic plating using the metal foil 53 as a seed layer, and thereafter, the plating resist 42 is removed. As illustrated in FIG. 3K, the plating film layers (25a) are respectively formed on the second conductor pads 22 via the metal foil 53. The plating film layers (25a) each have a width smaller than the width of each of the second conductor pads 22.

Figure 3L:
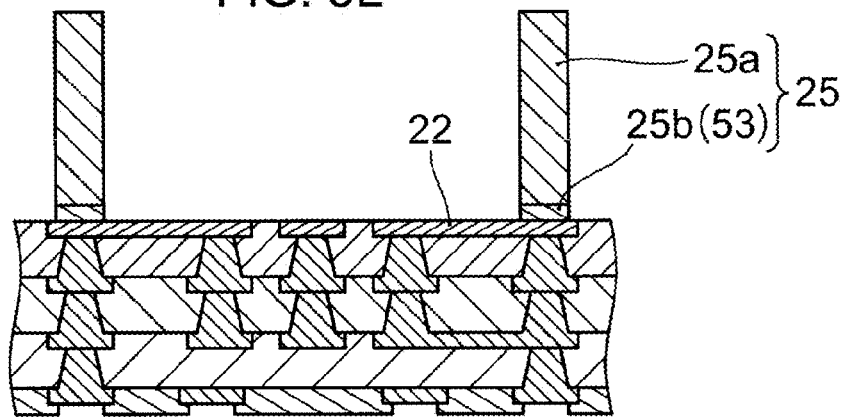

As illustrated in FIG. 3L, a portion of the metal foil 53 that is exposed without being covered by the plating film layers (25a) is removed by etching. Portions of the metal foil 53 that are respectively covered by the plating film layers (25a) are not removed and respectively remain between the second conductor pads 22 and the plating film layers (25a). The conductor posts 25 are formed from the metal foil layers (25b), which are the remaining portions of the metal foil 53, and the plating film layers (25a).

Figure 3M:
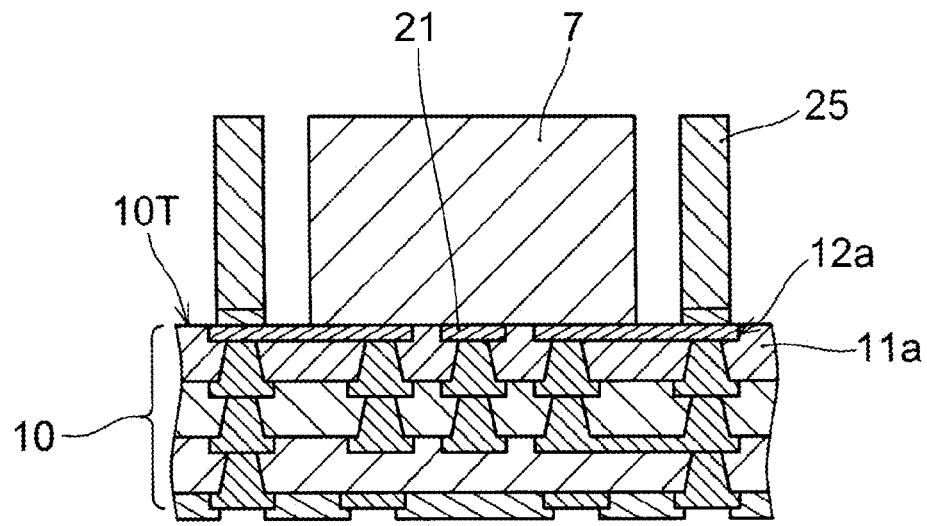
Figure 3N:
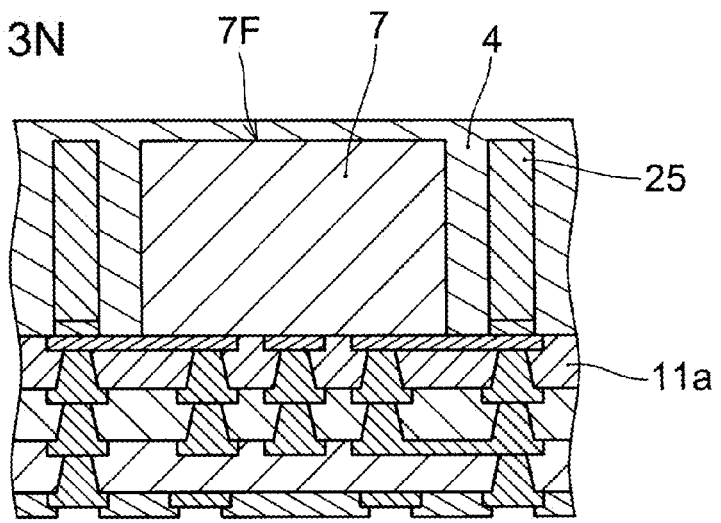

As illustrated in FIG. 3M, the dummy member 7 is arranged in a formation region of the cavity 5 (see FIG. 1). The dummy member 7 is, for example, a resin film that is formed to have substantially the same size and shape as the formation region of the cavity 5. For example, a peelable resin film can be used that can be in close contact with the first conductor layer (12a) and the first resin insulating layer (11a) but cannot be firmly bonded to the first conductor layer (12a) and the first resin insulating layer (11a). For example, the resin film may be bonded to the first conductor layer (12a) and the first resin insulating layer (11a) using an adhesive (not illustrated in the drawings). For the resin film and the adhesive, materials that do not bond to the mold resin layer 4 formed in a process to be described later (see FIG. 3N) are preferred. The resin film, for example, is formed from a resin material such as polyimide. Further, as the adhesive, any adhesive having a degree of adhesiveness that allows the adhesive to be peeled from the first conductor pads 21 and the first resin insulating layer (11a) can be used. The depth of the cavity 5 can be easily adjusted by suitably selecting a thickness of the resin film and/or a thickness of the adhesive. Or, it is also possible that the dummy member 7 is formed using a dry film resist. In this case, a thick dry film resist is laminated on the first conductor layer (12a) and the first resin insulating layer (11a) in such a size and shape as to cover the formation region of the cavity 5 on the second surface (10T) of the laminate 10. The dry film resist has a thickness of, for example, 50 μm or more and 150 μm or less. This thickness is substantially equal to the depth of the cavity 5. By exposing and developing the dry film resist, a cured dummy member 7 having substantially the same size and shape as the formation region of the cavity 5 is formed in the formation region of the cavity 5.

Subsequently, the mold resin layer 4 is formed covering the dummy member 7 and the conductor posts 25 (see FIG. 3N). A mold resin can be supplied, for example, in a liquid or paste form by discharging the mold resin from a nozzle. It is also possible that a film-like resin material is laminated on the dummy member 7 and the conductor posts 25. The dummy member 7, the conductor posts 25, the first resin insulating layer (11a) and the like can be covered by the resin material that is softened by heating or the like. The mold resin layer 4 is formed such that the surface of the mold resin layer 4 is positioned above one surface (7F) of the dummy member 7. The mold resin layer 4 is formed to have a thickness of, for example, 50 μm or more and 150 μm or less.

Figure 3O:
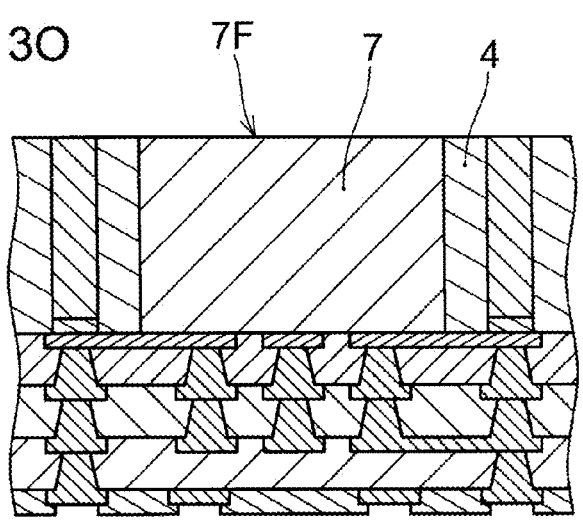
Figure 3P:
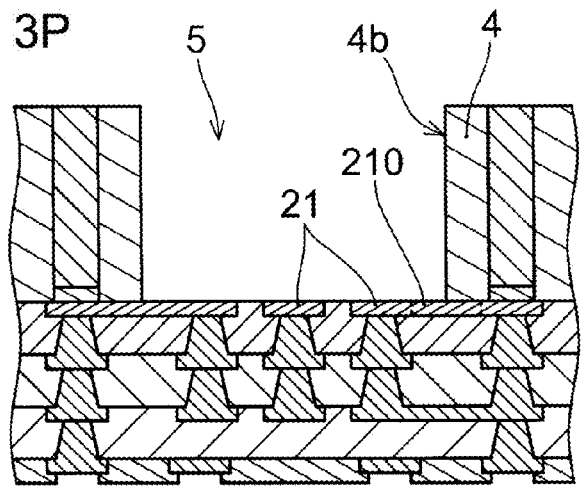

As illustrated in FIG. 3O, the surface side of the mold resin layer 4 is polished or ground such that the one surface (7F) of the dummy member 7 is exposed from the mold resin layer 4. Preferably, the polishing or grinding of the mold resin layer 4 is terminated when the one surface (7F) of the dummy member 7 is exposed. The depth of the cavity 5 becomes substantially equal to the thickness of the dummy member 7. Further, in order to form a cavity 5 of a desired depth, it is also possible that a portion of the dummy member 7 on the one surface (7F) side and the mold resin layer 4 are polished or ground until the thickness of the dummy member 7 is equal to the desired depth of the cavity 5. For example, sandblasting, buffing, chemical mechanical polishing (CMP) or the like is used for the polishing or grinding of the mold resin layer 4. However, the polishing and grinding methods are not limited to these methods.

Next, the dummy member 7 is removed from the halfway-processed printed wiring board. For example, a tool sucks on the one surface (7F) of the dummy member 7 and the dummy member 7 is pulled up. When the adhesive is used, preferably, together with the dummy member 7, the adhesive is also removed. It is also possible that the dummy member 7 and the adhesive are removed using a solvent or the like. As illustrated in FIG. 3P, the through hole (4b) penetrating the mold resin layer 4 is forming. After the formation of the through hole (4b), in order to remove resin residues of the dummy member 7 and residues of the adhesive, a desmear treatment in the through hole (4b) may be performed by immersing the through hole (4b) in a permanganate solution or the like. The removal of the residues may also be performed by blasting or the like. By the formation of the through hole (4b), the cavity 5 surrounded by the mold resin layer 4 is formed. The first conductor pads 21 are exposed in the cavity 5. One end side of each of the fan-out wirings (conductor patterns 210) connecting to the first conductor pads 21 is exposed in the cavity 5, and the other end side of each of the fan-out wirings is covered by the mold resin layer 4.

Through the above processes, the printed wiring board 1 is completed. Thereafter, for example, the printed wiring board 1 may be subjected to a surface treatment using water-soluble pre-flux (OSP) or the like. On the completed printed wiring board 1, an electronic component (not illustrated in the drawings) may be connected to the first conductor pads 21, and a motherboard or another printed wiring board (not illustrated in the drawings) may be connected to the end surfaces (25T) of the conductor posts 25, so as to form a part of a semiconductor package. Since the fan-out wirings from the inside of the cavity 5 connecting the first conductor pads 21 to the second conductor pads 22 are formed in the printed wiring board 1, an electronic component mounted in the cavity 5 and another printed wiring board or the like connected to the conductor posts 25 can be connected to each other via a short path. It is possible that electrical characteristics of a semiconductor package using the printed wiring board 1, or an electronic device in which the semiconductor package is used, are improved.

Next, another example of a method for manufacturing a printed wiring board of the embodiment is described with reference to FIG. 4A-4S.

Figure 4A:
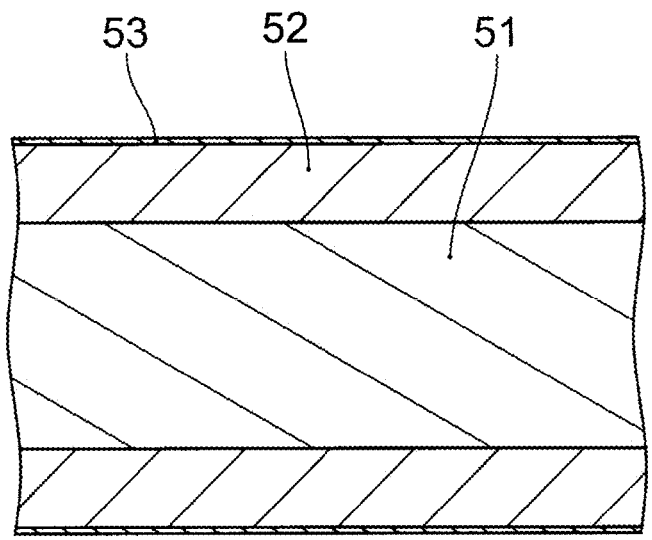
FIG. 4A-4S illustrate a method for manufacturing a printed wiring board according to another embodiment of the present invention.
Figure 4B:
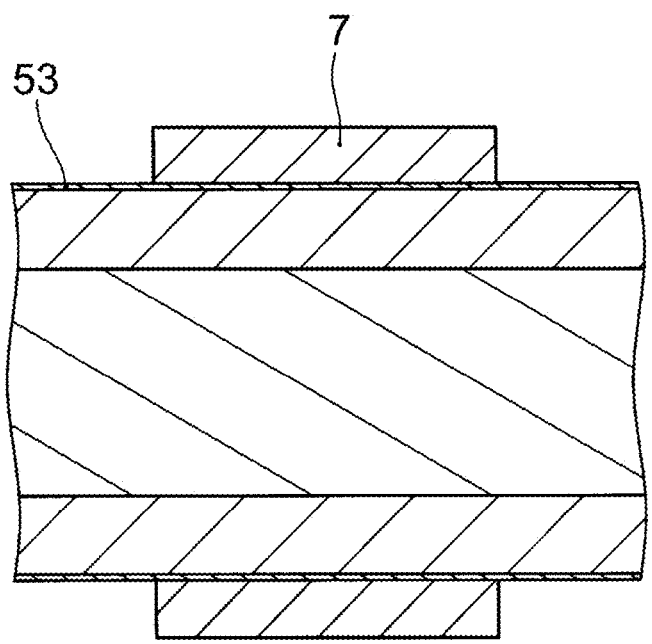

As illustrated in FIG. 4A, a base plate 51 and a metal foil 53 with a carrier copper foil 52 are prepared in the same way as in the process of FIG. 3A. As illustrated in FIG. 4B, a dummy member 7 is arranged in the formation region of the cavity 5. For the dummy member 7, similar to the process of FIG. 3M, a peelable dry film resist or the like can be used that can be in good contact with the conductor layer, the resin insulating layer and the mold resin layer but cannot be firmly bonded to the conductor layer, the resin insulating layer and the mold resin layer. For example, the dry film resist is laminated on the metal foil 53. In this example, different from the example of FIG. 3M, the dry film resist can have a thickness smaller than the depth of the cavity 5. For example, the dry film resist has a thickness of 50 μm or more and 150 μm or less. By exposing and developing the dry film resist, a cured dummy member 7 having substantially the same size and shape in a plan view as the formation region of the cavity 5 is formed in the formation region of the cavity 5. Or, it is also possible that a tape-like resin film is similarly affixed to the metal foil 53 so as to cover the formation region of the cavity 5 and is cut into substantially the same size and shape in a plan view as the formation region of the cavity 5 by laser processing. After the cutting, an unwanted portion of the resin film is removed. Similar to the dry film resist, the resin film may have a thickness smaller than the depth of the cavity 5.

Figure 4C:
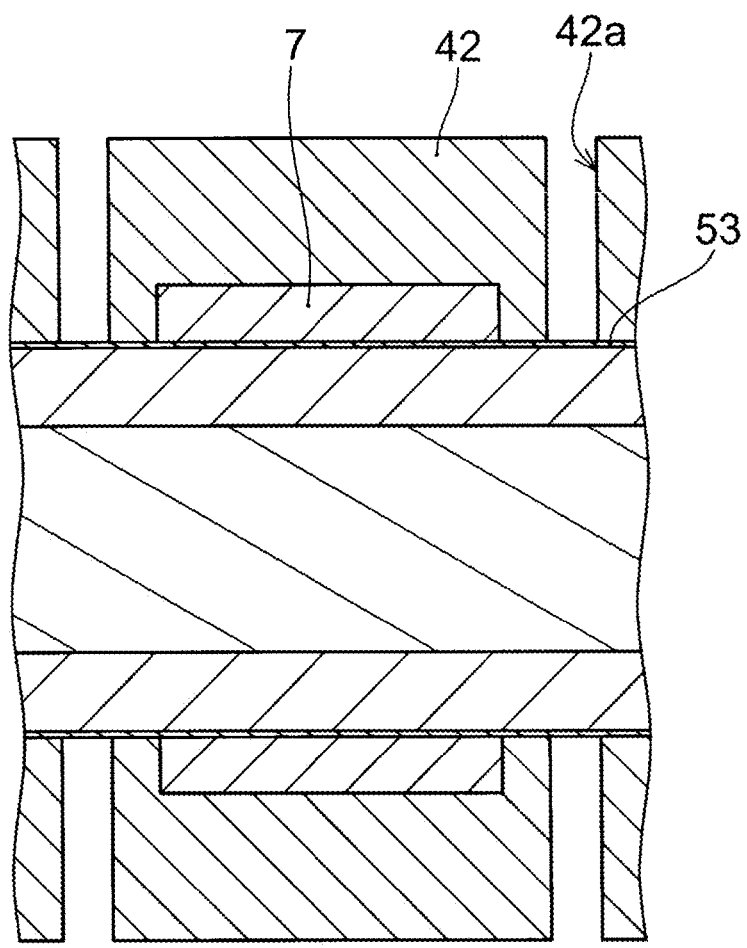

As illustrated in FIG. 4C, similar to that in the process of FIG. 3J, a plating resist 42 for the formation of the conductor posts is formed covering the dummy member 7 on the metal foil 53. Similar to the process of FIG. 3J, openings (42a) are provided in the plating resist 42 at formation positions of the conductor posts 25. The metal foil 53 is exposed at bottom surfaces of the openings (42a).

Figure 4D:
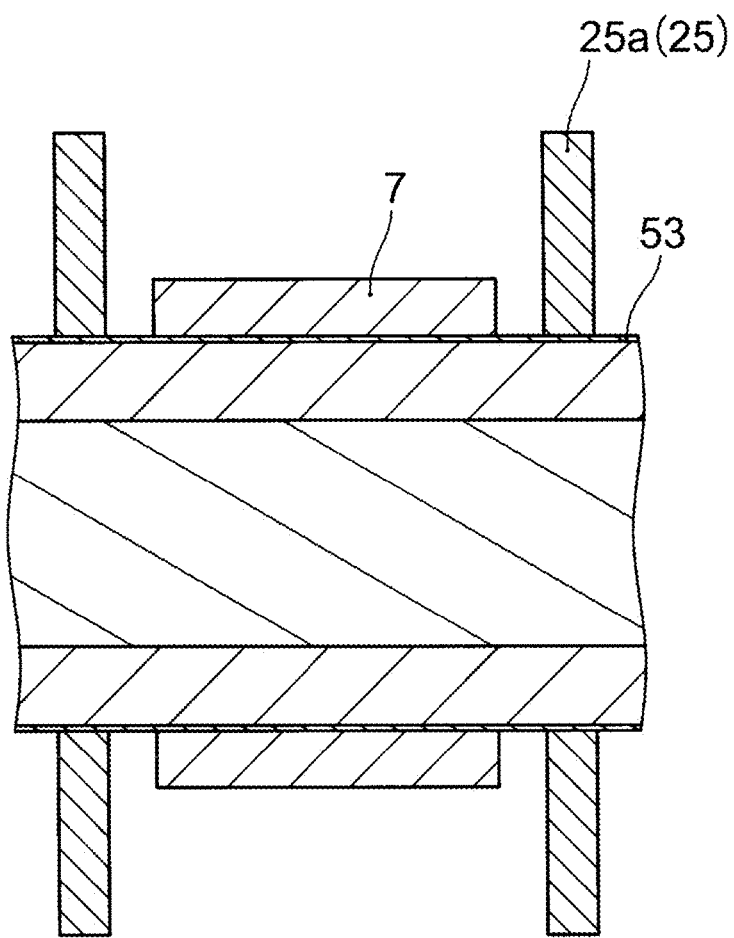

As illustrated in FIG. 4D, a plating film layer (25a) is formed in each of the openings (42a) using the metal foil 53 as a seed layer. Thereafter, the plating resist 42 is removed. The conductor posts 25 are formed on the metal foil 53 from the plating film layers (25a). The conductor posts 25 are formed so as to be positioned on the second surface (10T) side of the laminate 10 (see FIG. 4M) to be formed in subsequent processes.

Figure 4E:
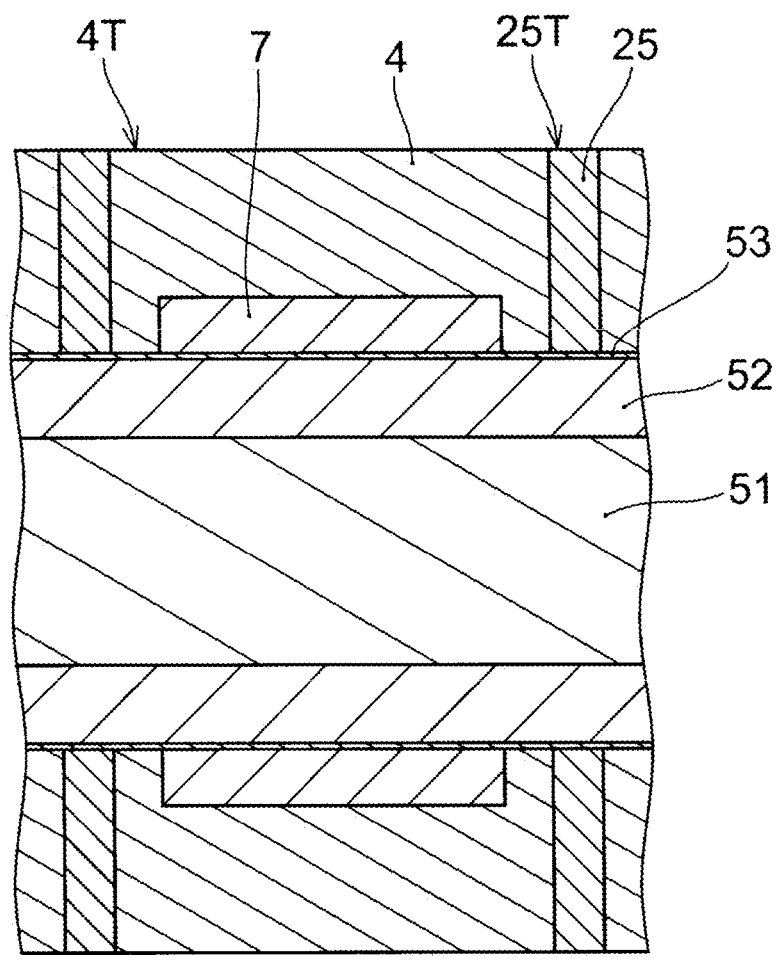

As illustrated in FIG. 4E, similar to the process of FIG. 3N, the mold resin layer 4 is formed covering the dummy member 7 and the conductor posts 25. Similar to the conductor posts 25, the mold resin layer 4 is formed so as to be positioned on the second surface (10T) side of the laminate 10 to be formed in subsequent processes. That is, in subsequent processes, the laminate 10 is formed such that the second surface (10T) faces the conductor posts 25 and the mold resin layer 4.

Next, similar to the process of FIG. 3O, a surface side of the mold resin layer 4 is polished. The end surfaces (25T) of the conductor posts 25 are exposed on the surface (4T) of the mold resin layer 4.

Figure 4F:
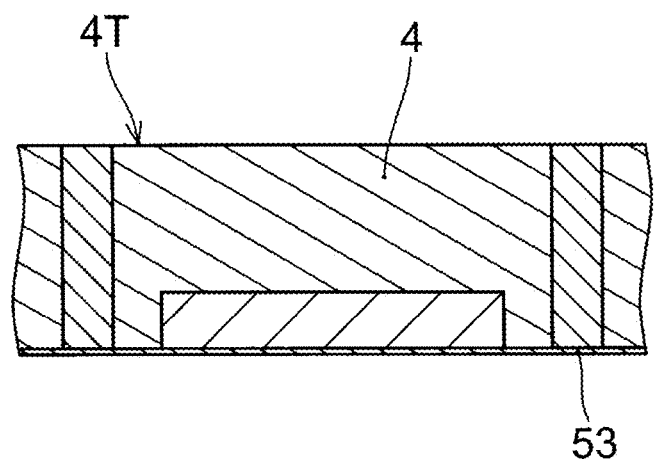

In the same was as in the process of FIG. 3I, the carrier metal foil 52 bonded to the base plate 51 is separated from the metal foil 53. Two halfway-processed printed wiring boards are obtained. FIG. 4F illustrates one of the two obtained halfway-processed printed wiring boards. The halfway-processed printed wiring board has one surfaced where the metal foil 53 is exposed on the entire surface, and has the other surface on the surface (4T) side of the mold resin layer 4.

Figure 4G:
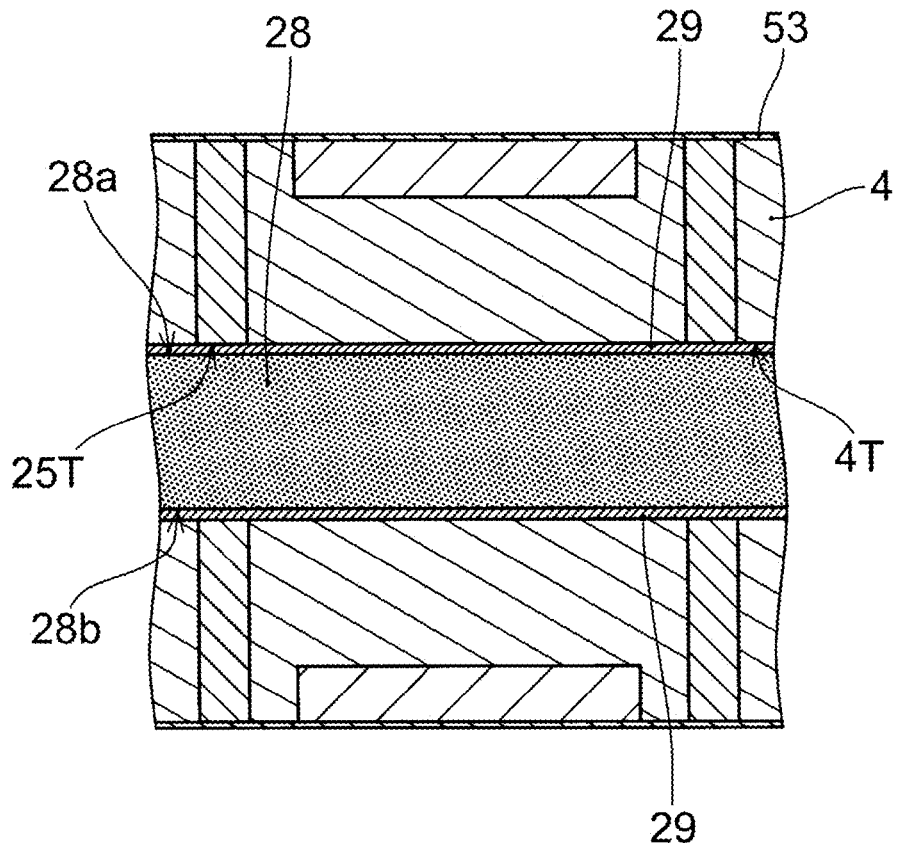

Subsequently, a support plate 28 (see FIG. 4G) is prepared that has one surface (28a) and the other surface (28b) that is on an opposite side of the one surface (28a), and in which an adhesive layer 29 is provided on each of both surfaces on the one surface (28a) side and the other surface (28b) side. As illustrated in FIG. 4G, the two halfway-processed printed wiring boards obtained in the process of FIG. 4F are respectively bonded to the one surface (28a) and the other surface (28b) of the support plate 28 via the adhesive layers 29 in orientations in which the surfaces (4T) of the mold resin layers 4 respectively face the adhesive layers 29. Due to the support plate 28, the halfway-processed printed wiring boards can be supported. Further, processes illustrated in FIG. 4H-4M to be described later can be performed simultaneously with respect to the two halfway-processed printed wiring boards bonded to the two sides of the support plate 28. A material having appropriate rigidity can be used as the support plate 28. For example, as the support plate 28, a glass epoxy substrate obtained by curing a prepreg, or a metal plate similar to the base plate 51 (see FIGS. 3A and 4A), or a double-sided copper-clad laminated plate or the like can be used. The support plate 28 has a thickness of, for example, 100 μm or more and 500 μm or less. A material that forms the adhesive layer 29 is not particularly limited as long as the material can adhere to the support plate 28 and the mold resin layer 4. The support plate 28 is separated and removed after the laminate 10 is formed on the halfway-processed printed wiring board as illustrated in a process of FIG. 4N to be described later. Therefore, as the material of the adhesive 29, in particular, a material is preferred that has moderate adhesiveness but does not develop a strong adhesive force with respect to the mold resin layer 4 and the end surfaces (25T) of the conductor posts 25. A material is preferred that at least develops a strong adhesive force with respect to the support plate 28 other than with respect to the mold resin layer 4 and the like.

As illustrated in FIG. 4H-4M, the laminate 10 is formed on the metal foil 53 of each of the halfway-processed printed wiring boards bonded to the support plate 28. In this example, two laminates 10 are simultaneously formed on the surfaces (28a, 29b) on both sides of the support plate 28. However, in the following description with reference to FIG. 4H-4M, description with respect to the other surface (28b) side of the support plate 28 is omitted. Further, only the one surface (28a) side of the support plate 28 is illustrated in FIG. 4H-4M.

Figure 4H:
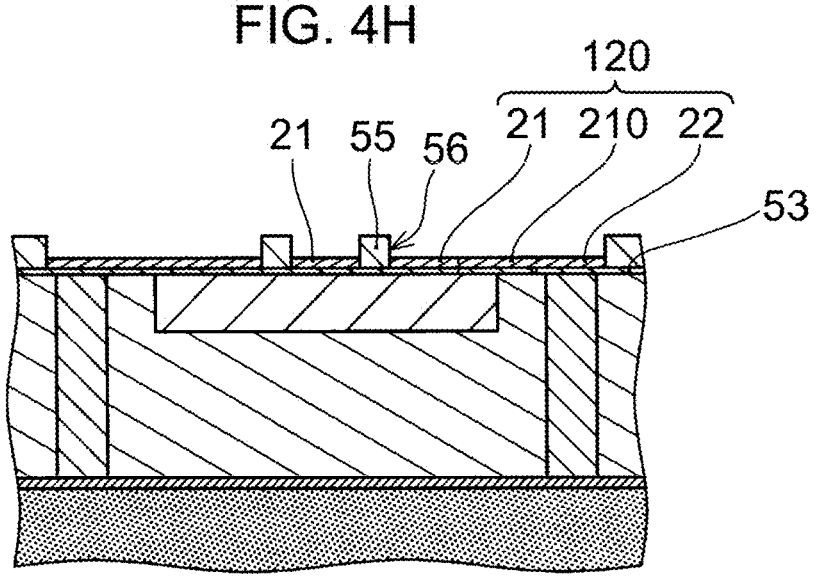

As illustrated in FIG. 4H, similar to the process of FIG. 3B, a plating resist layer 55 is formed on the metal foil 53. An electrolytic plating film 120 that forms the multiple first conductor pads 21, the multiple second conductor pads 22 and the fan-out wirings (conductor patterns 210) is formed in openings 56 of the plating resist layer 55 by electrolytic plating using the metal foil 53 as a seed layer.

Figure 4I:
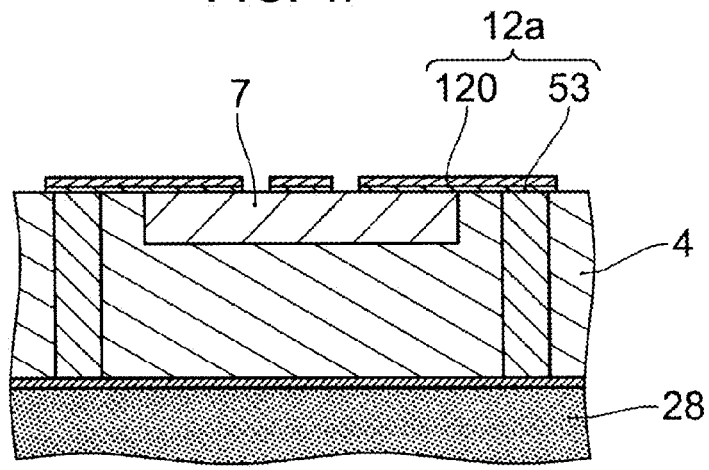
Figure 4J:
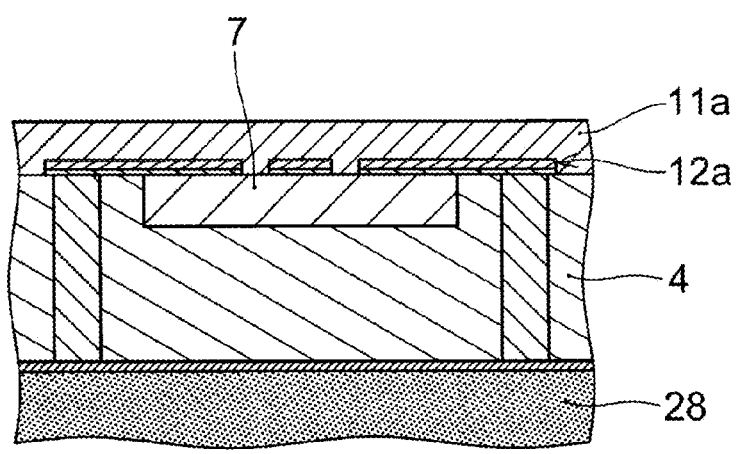
Figure 4K:
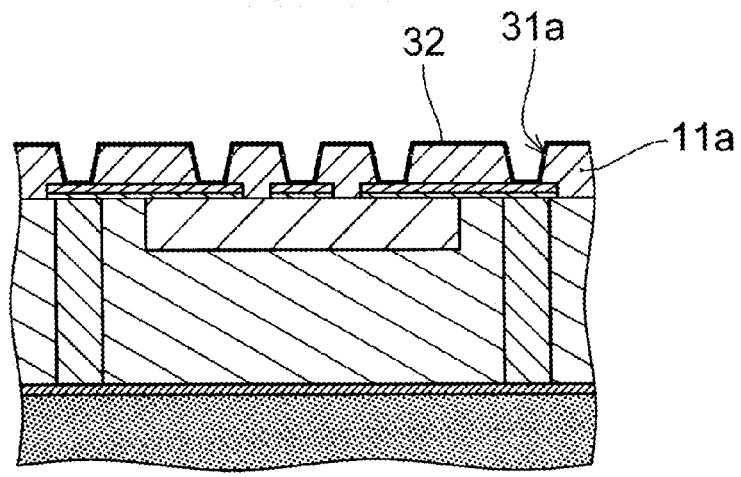
Figure 4L:
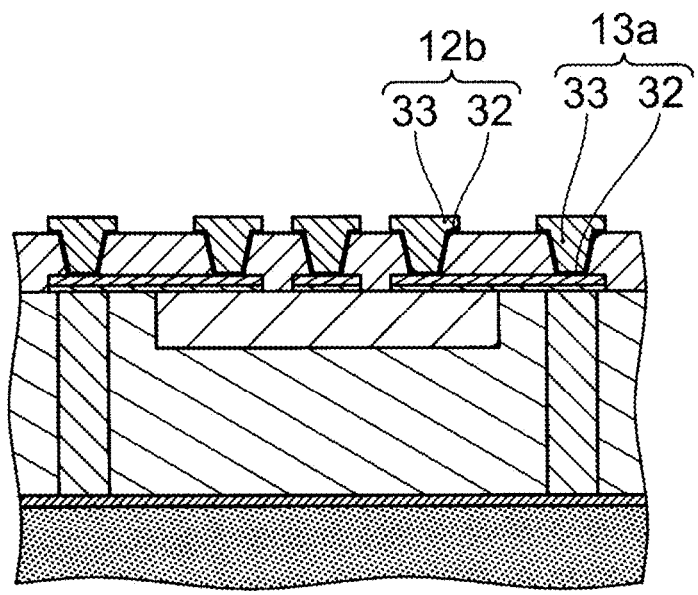
Figure 4M:
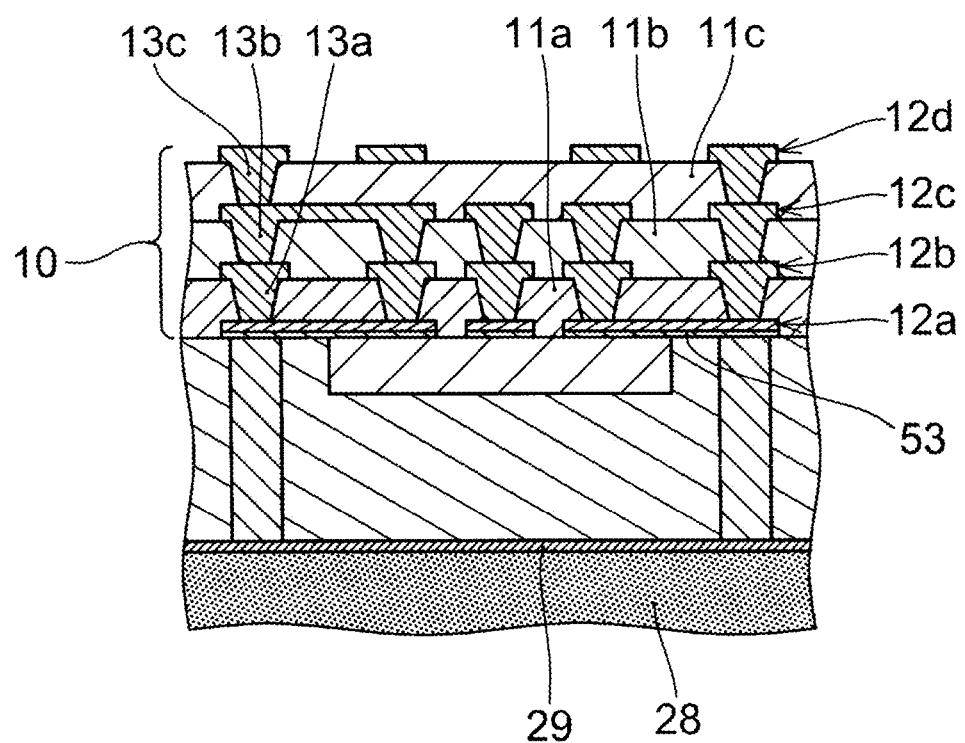

After the formation of the electrolytic plating film 120, the plating resist layer 55 is removed. The metal foil 53 exposed by the removal of the plating resist layer 55 is removed by etching. As a result, the first conductor layer (12a) is formed from the two layers including the metal foil 53 and the electrolytic plating film 120 as illustrated in FIG. 4I.

Subsequently, in the same way as the processes FIG. 3C-3G, the laminate 10 is formed by alternately laminating the resin insulating layers and the conductor layers on the first conductor layer (12a). The first resin insulating layer (11a) covering the first conductor layer (12a) is formed on a surface of the mold resin layer 4 on an opposite side of the support plate 28 side (see FIG. 4J). Then, conduction holes (31a) penetrating the first resin insulating layer (11a) are formed, and a metal layer 32 is formed in the conduction holes (31a) and on a surface of the first resin insulating layer (11a) (see FIG. 4K). An electrolytic plating film 33 is formed by electrolytic plating using the metal layer 32 as a seed layer, and the second conductor layer (12b) and the first via conductors (13a) are formed (see FIG. 4L). By repeating processes similar to the processes of FIG. 4J-4L, the second resin insulating layer (11b), the third conductor layer (12c) and the second via conductors (13b) are formed, and, further, the third resin insulating layer (11c), the fourth conductor layer (12d) and the third via conductors (13c) are formed (see FIG. 4M). The laminate 10 is formed on the metal foil 53.

Figure 4N:
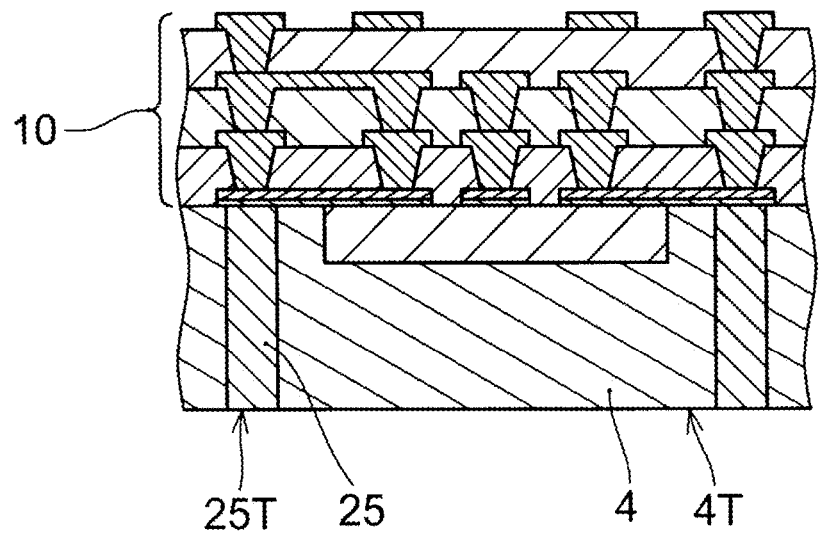

As illustrated in FIG. 4N, a support plate 18 is peeled off. By peeling off the support plate 18, the surface (4T) of the mold resin layer 4 and the end surfaces (25T) of the conductor posts 25 are exposed. As described above, the support plate 28 is adhered to the surface (4T) side of the mold resin layer 4 of the halfway-processed printed wiring board by the peelable adhesive 29. The support plate 28 and the halfway-processed printed wiring board can be easily separated from each other by pulling the two in mutually opposite directions. Depending on adhesive properties of the adhesive layer 29, the support plate 28 and the halfway-processed printed wiring board may be pulled apart from each other while ultraviolet irradiation or heating is performed, or after ultraviolet irradiation or heating is performed.

Figure 4O:
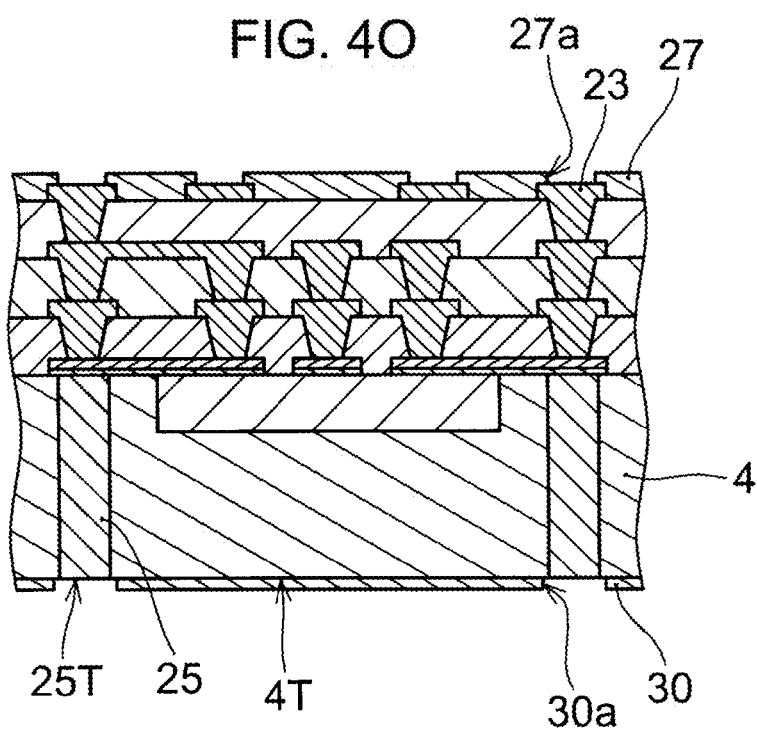

As illustrated in FIG. 4O, similar to the process of FIG. 3H, the solder resist layer 27 having the openings (27a) on the third conductor pads 23 is formed. In the example illustrated in FIG. 4O, in the same way, a solder resist layer 30 having openings (30a) that respectively expose the end surfaces (25T) of the conductor posts 25 is also formed on the surface (4T) side of the mold resin layer 4.

Figure 4P:
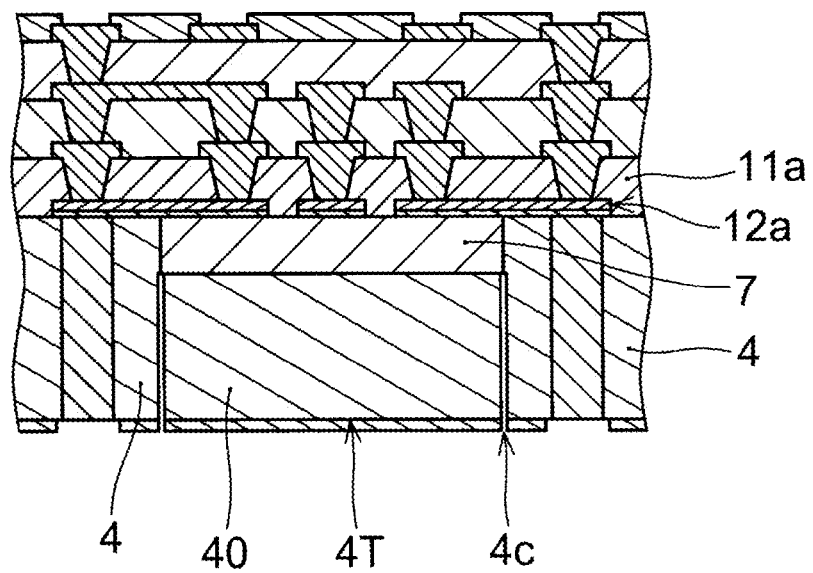

As illustrated in FIG. 4P, a frame-shaped groove (4c) is formed in the mold resin layer 4 from the surface (4T) side of the mold resin layer 4. The frame-shaped groove (4c) is preferably formed to reach the dummy member 7. However, it is also possible that the frame-shaped groove (4c) does not reach the dummy member 7. It is sufficient as long as a portion 40 of the mold resin layer 4 covering the dummy member 7 and surrounded by the frame-shaped groove (4c) can be removed (see FIG. 4Q). The groove (4c) is formed to surround the formation region of the cavity 5 of the printed wiring board 1. That is, the groove (4c) is formed along an outer edge portion of the dummy member 7. The groove (4c) is formed, for example, by router processing. Preferably, a router capable of controlling a processing range in a thickness direction of the mold resin layer 4 is used.

Figure 4Q:
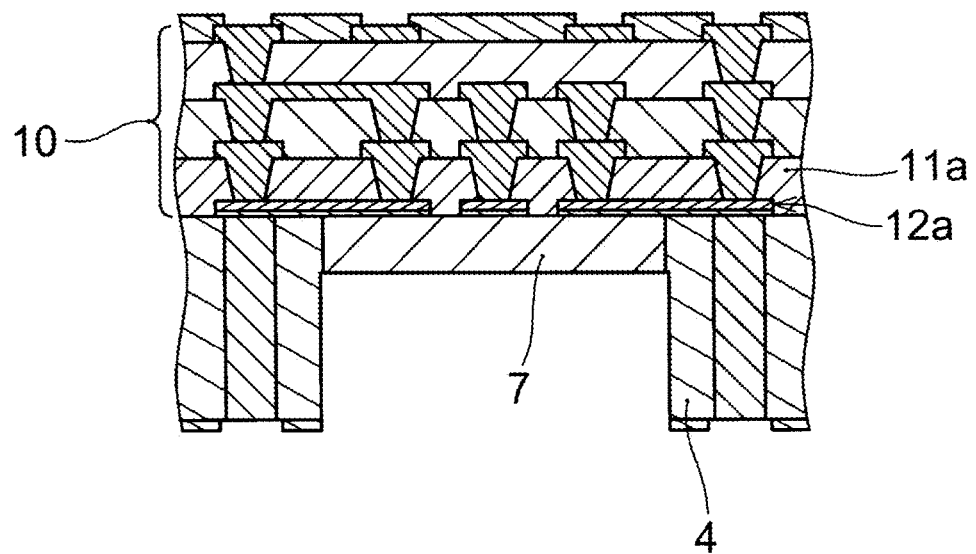

Subsequently, the portion 40 of the mold resin layer 4 surrounded by the frame-shaped groove (4c) is peeled off from the dummy member 7 and is removed from the mold resin layer 4. As described above, the dummy member 7 is formed of a peelable resin material that can be in close contact with the mold resin layer 4 but cannot be firmly bonded to the mold resin layer 4. Therefore, the portion 40 surrounded by the frame-shaped groove (4c) and the remaining mold resin layer 4 can be easily separated by pulling the two in mutually opposite directions. For example, the portion 40 surrounded by the groove (4c) is fixed to a jig or the like by vacuum suction, adhesion or the like. By pulling the jig or the like, the portion 40 surrounded by the groove (4c) is peeled off from the dummy member 7. An example of this state is illustrated in FIG. 4Q.

Figure 4R:
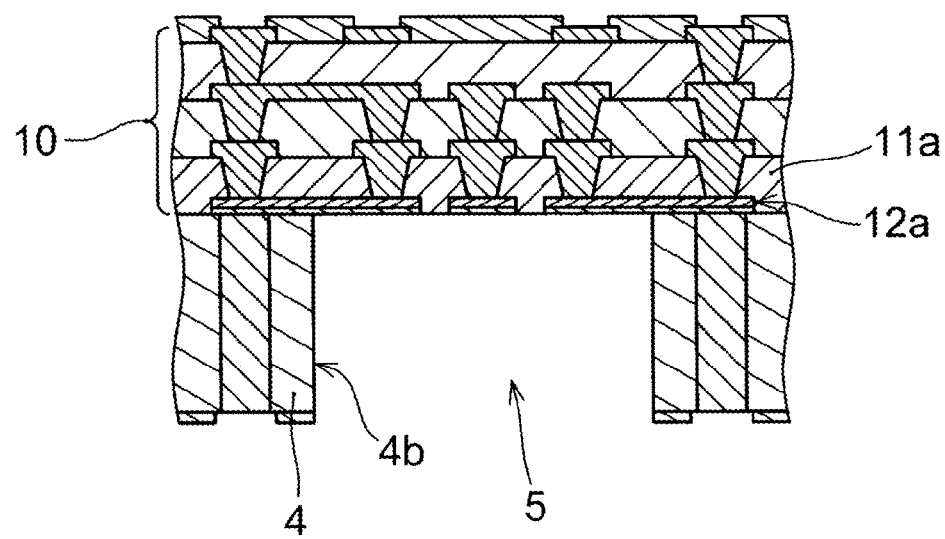

As illustrated in FIG. 4R, the dummy member 7 exposed in the formation region of the cavity 5 is removed by blasting or the like. The through hole (4b) penetrating the mold resin layer 4 is formed.

It is also possible that, in the process of removing the portion 40 surrounded by the frame-shaped groove (4c), the dummy member 7 is peeled off from the first conductor layer (12a) and the first resin insulating layer (11a), and is removed together with the portion 40 of the mold resin layer 4 surrounded by the frame-shaped groove (4c). In this case, the through hole (4b) penetrating the mold resin layer 4 illustrated in FIG. 4R is formed without going through the process illustrated in FIG. 4Q. After the formation of the through hole (4b), a desmear treatment or the like can be performed to remove residues in the through hole (4b). By the formation of the through hole (4b), the cavity 5 surrounded by the mold resin layer 4 is formed.

Figure 4S:
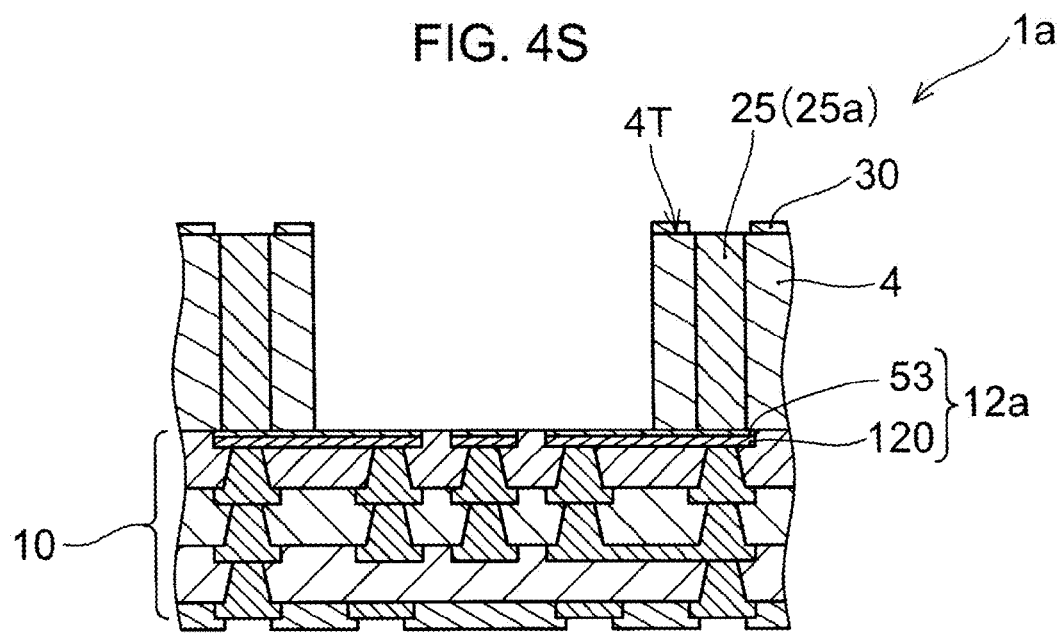

Through the above processes, a printed wiring board (1a) of the other embodiment illustrated in FIG. 4S is completed. The printed wiring board (1a) has the same structure as that of the printed wiring board 1 of FIG. 1 except that the printed wiring board (1a) has the conductor posts 25 that are formed from the plating film layer (25a), that the first conductor layer (12a) includes two layers including the metal foil 53 and the electrolytic plating film 120, and that the printed wiring board (1a) also has the solder resist layer 30 on the surface (4T) of the mold resin layer 4.

The printed wiring board of the embodiment is not limited to the structures illustrated in FIGS. 1 and 4S. It is also possible that the first conductor layer (12a) and the fourth conductor layer (12d) include other conductor patterns in addition to the first-third conductor pads (21-23). It is also possible that a stack via connecting a conductor post 25 to a third conductor pad 23 is not formed at all. Further, the method for manufacturing the printed wiring board of the embodiment is not limited to the methods described with reference to FIGS. 3A-3P and 4A-4S. With respect to the method for manufacturing the printed wiring board of the embodiment, it is possible that a process other than the processes described above is added, and it is also possible that some of the processes described above are omitted.

For the printed circuit board of Japanese Translation of PCT International Application Publication No. 2013-520007, the laser beam is irradiated toward the laser stopper stepped portion in the circuit pattern on the surface of the base circuit board. The circuit pattern is formed along a peripheral edge of the cavity region. Therefore, a degree of freedom in designing the circuit pattern at the peripheral edge portion of the cavity region is low. Further, fan-out wirings that connect mounting pads or the like exposed at a bottom of the cavity region to conductor pads or the like outside the cavity are difficult to be arranged in the same surface-layer conductor layer as the mounting pads. Along with arranging the fan-out wirings in an inner layer, a multilayer structure of the printed circuit board may be required.

A printed wiring board according to an embodiment of the present invention includes: a laminate that is formed from alternately laminated conductor layers and resin insulating layers, has conductor layers laminated on both sides of at least one resin insulating layer, and has a first surface and a second surface that is on the opposite side of the first surface; conductor posts that are formed on the second surface of the laminate; and a mold resin layer that is formed on the second surface of the laminate and covers side surfaces of the conductor posts. The laminate has a first conductor layer that is embedded in a resin insulating layer that forms the second surface, one surface of the first conductor layer being exposed on the second surface side. The first conductor layer includes multiple first conductor pads and multiple second conductor pads that are formed on an outer peripheral side of the multiple first conductor pads on the second surface. The mold resin layer has a cavity that exposes all of the first conductor pads. The conductor posts are respectively formed on exposed surfaces of the second conductor pads on the second surface side of the laminate. The first conductor layer includes fan-out wirings extending from inside of the cavity to outside of the cavity.

A method for manufacturing a printed wiring board according to another embodiment of the present invention includes: forming a laminate in which a conductor layer and a resin insulating layer are laminated, and that has a first surface and a second surface that is on an opposite side of the first surface, and that has a first conductor layer including multiple first conductor pads on the second surface; forming conductor posts such that the conductor posts are positioned on the second surface side of the laminate; and forming a mold resin layer that is positioned on the second surface side of the laminate and covers side surfaces of the conductor posts, and has a cavity that exposes the multiple first conductor pads on the second surface on a center side of the conductor posts. The formation of the cavity of the mold resin layer includes: forming a dummy member on the second surface side of the laminate and thereafter providing a mold resin layer; removing a portion of the mold resin layer on the dummy member; and removing the dummy member.

According to an embodiment of the present invention, design flexibility of conductor patterns near an outer peripheral edge portion of the cavity can be improved. An electronic component mounted inside the cavity can be connected to an electronic component mounted outside the cavity or an external electrical circuit via a short path. Further, an embodiment of the present invention can contribute to miniaturization and reduction in the number of layers of the printed wiring board.

Obviously, numerous modifications and variations of the present invention are possible in light of the above teachings. It is therefore to be understood that within the scope of the appended claims, the invention may be practiced otherwise than as specifically described herein.

The invention claimed is:

1. A printed wiring board, comprising:
   a laminate having a first surface and a second surface;
   a plurality of conductor posts formed on the second surface of the laminate on an opposite side with respect to the first surface of the laminate; and
   a mold resin layer formed on the second surface of the laminate such that the conductor posts is formed in the mold resin layer covering side surfaces of the conductor posts,
   wherein the laminate comprises a plurality of conductor layers and at least one resin insulating layer, the plurality of conductor layers includes a first conductor layer formed such that the first conductor layer is embedded in one of the at least one resin insulating layer forming the second surface of the laminate and has one surface being substantially flush with the second surface of the laminate and exposed on a second surface side of the laminate, the first conductor layer includes a plurality of first conductor pads and a plurality of second conductor pads formed such that the plurality of second conductor pads is formed on an outer peripheral side of the plurality of first conductor pads, the mold resin layer has a cavity exposing the first conductor pads, the plurality of conductor posts is formed on the plurality of second conductor pads respectively on the second surface side of the laminate, the first conductor layer includes a plurality of fan-out wirings extending from inside the cavity to outside the cavity, and the laminate comprises a plurality of via conductors formed in the resin insulating layer such that each of the via conductors is tapering from the first surface toward the second surface of the laminate.

2. A printed wiring board according to claim 1, wherein the first conductor layer is formed such that the first conductor layer does not have a conductor pattern extending between the fan-out wirings at a peripheral edge of the cavity.

3. A printed wiring board according to claim 1, wherein the mold resin layer is formed on the second surface of the laminate such that each of the conductor posts has an exposed surface exposed on a surface of the mold resin layer on an opposite side with respect to the second conductor pads.

4. A printed wiring board according to claim 1, wherein the at least one resin insulating layer of the laminate comprises a plurality of resin insulating layers, and the laminate comprises a plurality of via conductors formed in the plurality of resin insulating layers such that each of the via conductors is tapering from the first surface toward the second surface of the laminate.

5. A printed wiring board according to claim 1, wherein the laminate comprises a plurality of third conductor pads formed on one of the at least one resin insulating layer forming the first surface of the laminate, and a solder resist layer formed on the resin insulating layer forming the first surface of the laminate such that the solder resist layer has a plurality of openings exposing the plurality of third conductor pads, respectively.

6. A printed wiring board according to claim 1, wherein the plurality of conductor posts is formed such that each of the conductor posts comprises a metal foil portion formed on a respective one of the second conductor pads.

7. A printed wiring board according to claim 1, wherein the plurality of conductor posts is formed such that each of the conductor posts comprises a metal foil portion formed on a respective one of the second conductor pads and a plating film layer portion formed on the metal foil portion.

8. A printed wiring board according to claim 2, wherein the mold resin layer is formed on the second surface of the laminate such that each of the conductor posts has an exposed surface exposed on a surface of the mold resin layer on an opposite side with respect to the second conductor pads.

9. A printed wiring board according to claim 2, wherein the at least one resin insulating layer of the laminate comprises a plurality of resin insulating layers, and the laminate comprises a plurality of via conductors formed in the plurality of resin insulating layers such that each of the via conductors is tapering from the first surface toward the second surface of the laminate.

10. A printed wiring board according to claim 2, wherein the laminate comprises a plurality of third conductor pads formed on one of the at least one resin insulating layer forming the first surface of the laminate, and a solder resist layer formed on the resin insulating layer forming the first surface of the laminate such that the solder resist layer has a plurality of openings exposing the plurality of third conductor pads, respectively.

11. A printed wiring board according to claim 2, wherein the plurality of conductor posts is formed such that each of the conductor posts comprises a metal foil portion formed on a respective one of the second conductor pads.

12. A printed wiring board according to claim 2, wherein the plurality of conductor posts is formed such that each of the conductor posts comprises a metal foil portion formed on a respective one of the second conductor pads and a plating film layer portion formed on the metal foil portion.

13. A method for manufacturing a printed wiring board, comprising:
   forming a laminate having a first surface and a second surface;
   forming a plurality of conductor posts such that the plurality of conductor posts is positioned on the second surface of the laminate on an opposite side with respect to the first surface of the laminate; and
   forming a mold resin layer on the second surface of the laminate such that the plurality of conductor posts is positioned in the mold resin layer covering side surfaces of the conductor posts,
   wherein the forming of the laminate comprises laminating a plurality of conductor layers and at least one resin insulating layer, forming the plurality of conductor layers including a first conductor layer such that the first conductor layer is embedded in one of the at least one resin insulating layer forming the second surface of the laminate and has one surface being substantially flush with the second surface of the laminate and exposed on a second surface side of the laminate, forming a plurality of via conductors in the resin insulating layer such that each of the via conductors is tapering from the first surface toward the second surface of the laminate, and forming the first conductor layer including a plurality of first conductor pads and a plurality of second conductor pads such that the plurality of second conductor pads is formed on an outer peripheral side of the plurality of first conductor pads, the forming of the mold resin layer comprises forming a cavity in the mold resin layer such that the cavity exposes the first conductor pads on the second surface of the laminate, the forming of the conductor posts comprises forming the conductor posts on the second conductor pads respectively on the second surface side of the laminate, the forming of the laminate comprises forming the first conductor layer such that the first conductor layer includes a plurality of fan-out wirings connected to the first conductor pads and formed to be extending from inside the cavity to outside the cavity.

14. A method for manufacturing a printed wiring board according to claim 13, wherein the forming of the mold resin layer comprises forming a dummy member on the second surface of the laminate, forming the mold resin layer covering the dummy member, removing a portion of the mold resin layer on the dummy member, and removing the dummy member from the second surface of the laminate such that the cavity exposing the first conductor pads is formed in the mold resin layer.

15. A method for manufacturing a printed wiring board according to claim 13, wherein the forming of the mold resin layer comprises forming a dummy member on a surface of a metal foil positioned on a base plate, and forming the mold resin layer such that the mold resin layer covers the dummy member and the side surfaces of the conductor posts, and the forming of the laminate comprises removing the base plate after the forming of the mold resin layer, forming a conductor layer for the first conductor layer on another surface of the metal foil on an opposite side with respect to the mold resin layer, and laminating, on the conductor layer for the first conductor layer, at least one pair of a resin insulating layer and a conductor layer of the laminate.

16. A method for manufacturing a printed wiring board according to claim 14, wherein the removing of the portion of the mold resin layer comprises polishing or grinding the portion of the mold resin layer.

17. A method for manufacturing a printed wiring board according to claim 13, wherein the forming of the cavity comprises forming, in the mold resin layer, a groove in a frame shape along an outer edge of the dummy member, and removing a portion of the mold resin layer surrounded by the groove.

18. A method for manufacturing a printed wiring board according to claim 13, wherein the forming of the laminate comprises forming the first conductor layer such that the first conductor layer is formed such that the first conductor layer does not have a conductor pattern extending along a peripheral edge of the cavity between the fan-out wirings.

19. A method for manufacturing a printed wiring board according to claim 13, further comprising:
forming a solder resist layer on the first surface of the laminate.

20. A method for manufacturing a printed wiring board according to claim 13, wherein the plurality of conductor posts is formed after the forming of the laminate.

* * * * *